(12) United States Patent
Nishiwaki et al.

(10) Patent No.: US 8,525,217 B2
(45) Date of Patent: Sep. 3, 2013

(54) METHOD AND DEVICE FOR RESIN COATING

(75) Inventors: Kentaro Nishiwaki, Osaka (JP); Tomonori Itoh, Kyoto (JP); Masaru Nonomura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/593,104

(22) Filed: Aug. 23, 2012

(65) Prior Publication Data
US 2013/0052761 A1 Feb. 28, 2013

(30) Foreign Application Priority Data

Aug. 29, 2011 (JP) ................. 2011-185406

(51) Int. Cl.
*H01L 33/00* (2010.01)
*H01L 27/14* (2006.01)
*H01L 31/0232* (2006.01)
*H01L 21/00* (2006.01)

(52) U.S. Cl.
USPC ............. 257/99; 257/431; 257/436; 257/437; 257/E21.501; 257/E21.502; 257/E21.503; 257/E21.527; 438/27; 438/28; 438/51; 438/55; 438/64; 118/696; 118/712

(58) Field of Classification Search
USPC ......... 438/15, 27–29, 51, 55, 64, 99; 257/99, 257/431, 436, 437, E21.501, E21.502, E21.503, E21.527; 118/696, 712
See application file for complete search history.

(56) References Cited

U.S. PATENT DOCUMENTS

| | | | |
|---|---|---|---|
| 2008/0003371 A1* | 1/2008 | Ko | 427/402 |
| 2010/0301373 A1* | 12/2010 | Urano et al. | 257/98 |
| 2011/0053299 A1* | 3/2011 | Shimieu et al. | 438/27 |

FOREIGN PATENT DOCUMENTS
JP 2007-066969 3/2007

* cited by examiner

*Primary Examiner* — Mohsen Ahmadi
(74) *Attorney, Agent, or Firm* — Hamre, Schumann, Mueller & Larson, P.C.

(57) ABSTRACT

A device for resin coating is used for producing an LED package including an LED element covered with resin containing phosphor. In a state in which a trial coating material 43 is located by a clamp unit 63, a trial coating of resin applied to the trial coating material 43 is irradiated with excitation light and light emitted from the phosphor contained in the resin is measured by an emission characteristic measuring unit 39. A deviation of the measurement result of the emission characteristic measuring unit from a prescribed emission characteristic is determined, and then a proper amount of resin to be applied to the LED element is derived for actual production based on the deviation.

10 Claims, 31 Drawing Sheets

FIG. 4

RESIN COATING INFORMATION — 14

| | Bin CODE PROPER RESIN COATING AMOUNT SHORT <<< (WAVELENGTH 465nm) >>> LONG | | | | | |
|---|---|---|---|---|---|---|
| PHOSPHOR CONCENTRATION | [1] | [2] | [3] | [4] | [5] | ← 17 |
| D1 (5%) | VA0 | VB0 | VC0 | VD0 | VE0 | ← 15(1) |
| D2 (10%) | VF0 | VG0 | VH0 | VJ0 | VK0 | ← 15(2) |
| D3 (15%) | VL0 | VM0 | VN0 | VP0 | VR0 | ← 15(3) |

| | SHORT <<< (WAVELENGTH 465nm) >>> LONG | | | | |
|---|---|---|---|---|---|
| Bin CODE | [1] | [2] | [3] | [4] | [5] |
| PROPER RESIN COATING AMOUNT (PURE 5% RESIN) | VA0 | VB0 | VC0 | VD0 | VE0 |
| EMISSION CHARACTERISTIC MEASURED VALUE CHROMATICITY COORDINATE Z | ZA0 $(X_{A0}, Y_{A0})$ | ZB0 $(X_{B0}, Y_{B0})$ | ZC0 $(X_{C0}, Y_{C0})$ | ZD0 $(X_{D0}, Y_{D0})$ | ZE0 $(X_{E0}, Y_{E0})$ |
| THRESHOLD VALUE | ZA0 ±10% | ZB0 ±10% | ZC0 ±10% | ZD0 ±10% | ZE0 ±10% |

FIG. 14B

| | SHORT <<< (WAVELENGTH 465nm) >>> LONG | | | | |
|---|---|---|---|---|---|
| Bin CODE | [1] | [2] | [3] | [4] | [5] |
| PROPER RESIN COATING AMOUNT (PURE 10% RESIN) | VF0 | VG0 | VH0 | VJ0 | VK0 |
| EMISSION CHARACTERISTIC MEASURED VALUE CHROMATICITY COORDINATE Z | ZF0 $(X_{F0}, Y_{F0})$ | ZG0 $(X_{G0}, Y_{G0})$ | ZH0 $(X_{H0}, Y_{H0})$ | ZJ0 $(X_{J0}, Y_{J0})$ | ZK0 $(X_{K0}, Y_{K0})$ |
| THRESHOLD VALUE | ZF0 ±10% | ZG0 ±10% | ZH0 ±10% | ZJ0 ±10% | ZK0 ±10% |

FIG. 14C

| | SHORT <<< (WAVELENGTH 465nm) >>> LONG | | | | |
|---|---|---|---|---|---|
| Bin CODE | [1] | [2] | [3] | [4] | [5] |
| PROPER RESIN COATING AMOUNT (PURE 15% RESIN) | VL0 | VM0 | VN0 | VP0 | VR0 |
| EMISSION CHARACTERISTIC MEASURED VALUE CHROMATICITY COORDINATE Z | ZL0 $(X_{L0}, Y_{L0})$ | ZM0 $(X_{M0}, Y_{M0})$ | ZN0 $(X_{N0}, Y_{N0})$ | ZP0 $(X_{P0}, Y_{P0})$ | ZR0 $(X_{R0}, Y_{R0})$ |
| THRESHOLD VALUE | ZL0 ±10% | ZM0 ±10% | ZN0 ±10% | ZP0 ±10% | ZR0 ±10% |

FIG. 17A

|  | SHORT <<< (WAVELENGTH 465nm) >>> LONG | | | | |
|---|---|---|---|---|---|
| Bin CODE | [1] | [2] | [3] | [4] | [5] |
| ACTUAL RESIN COATING AMOUNT | VA1 | VB1 | VC1 | VD1 | VE1 |

FIG. 17B

| EMISSION CHARACTERISTIC MEASURED VALUE CHROMATICITY COORDINATE Z | ZA1 $(X_{A1}, Y_{A1})$ | ZB1 $(X_{B1}, Y_{B1})$ | ZC1 $(X_{C1}, Y_{C1})$ | ZD1 $(X_{D1}, Y_{D1})$ | ZE1 $(X_{E1}, Y_{E1})$ |
|---|---|---|---|---|---|
| DEVIATION | $\Delta X_A \, \Delta Y_A$ | $\Delta X_B \, \Delta Y_B$ | $\Delta X_C \, \Delta Y_C$ | $\Delta X_D \, \Delta Y_D$ | $\Delta X_E \, \Delta Y_E$ |

FIG. 17C

| DEVIATION | $\Delta X_A \, \Delta Y_A$ | $\Delta X_B \, \Delta Y_B$ | $\Delta X_C \, \Delta Y_C$ | $\Delta X_D \, \Delta Y_D$ | $\Delta X_E \, \Delta Y_E$ |
|---|---|---|---|---|---|
| THRESHOLD VALUE | ZA0 ±10% | ZB0 ±10% | ZC0 ±10% | ZD0 ±10% | ZE0 ±10% |

FIG. 17D

|  | SHORT <<< (WAVELENGTH 465nm) >>> LONG | | | | |
|---|---|---|---|---|---|
| Bin CODE | [1] | [2] | [3] | [4] | [5] |
| CORRECTED PROPER RESIN COATING AMOUNT | VA2 | VB2 | VC2 | VD2 | VE2 |

METHOD AND DEVICE FOR RESIN COATING

FIELD OF THE INVENTION

The present invention relates to a method and device for resin coating, the method and device being used for an LED package production system.

BACKGROUND OF THE INVENTION

In recent years, light-emitting diodes (LEDs) having excellent characteristics such as low power consumption and longevity have been widely used as light sources for a variety of illumination systems. Fundamental light emitted from LED elements is currently limited to three colors: red, green, and blue. Thus, appropriate white light for ordinary illumination is obtained as follows: white light is obtained by additive color mixture of the three colors of fundamental light, or pseudo white light is obtained by combining a blue LED and phosphor exhibiting fluorescent yellow that is complementary to blue. In recent years, the latter method has been widely used. Illumination systems including LED packages with combinations of blue LEDs and YAG phosphor have been used for the backlight of liquid crystal display panels (For example, see Japanese Patent Laid-Open No. 2007-66969).

In this example of the patent document, an LED package is configured as follows: an LED element is mounted in the bottom of a concave mounting part having reflecting surfaces on its side walls, and then silicone resin or epoxy resin that contains dispersed YAG phosphor particles is injected into the mounting part, forming a resin packaging part. The patent document further describes an example in which an excessive resin container is formed to equalize the heights of the resin packaging parts in the mounting parts after resin injection. The excessive resin container stores excessive resin that is injected more than a specified amount and discharged from the mounting parts. Hence, even if resin dispensed from a dispenser varies in amount during the resin injection, the resin packaging parts formed on the LED elements contain a constant amount of resin with a specified height.

DISCLOSURE OF THE INVENTION

In the prior art example, however, the LED elements varied in emission wavelength may disadvantageously cause variations in the emission characteristics of LED package products. To be specific, the LED elements are simultaneously fabricated on a wafer in a production process, and thus the LED elements divided from the wafer always vary in emission wavelength because of various error factors in the production process, for example, uneven compositions in the film formation of the wafer. In this example, the resin packaging parts covering the LED elements are set to have equal heights and thus variations in the emission wavelengths of the LED elements are directly reflected on the varying emission characteristics of the LED package products, inevitably increasing the number of defective items deviating from a quality tolerance. Hence, in the conventional LED package production technique, the LED elements varied in emission wavelength may disadvantageously cause variations in the emission characteristics of the LED package products, leading to a lower production yield.

An object of the present invention is to provide a method and device for resin coating by which LED packages can have uniform emission characteristics with a higher production yield even in the case where LED elements are varied in emission wavelength.

An aspect of a device for resin coating according to the present invention includes: a resin coating part that applies resin containing phosphor; a first coating control unit that controls the resin coating part to apply the resin to a trial coating material; a second coating control unit that controls the resin coating part to apply the resin to an LED element; a trial coating material loading part loaded with the trial coating material on which the resin has been applied under the control of the first coating control unit; a light source that emits excitation light for exciting the phosphor; an emission characteristic measuring unit that measures the emission characteristic of light emitted from the resin by irradiating the trial coating of the resin on the trial coating material with the excitation light; a clamp unit that locates the trial coating material; a coating amount deriving unit that determines a deviation of the measurement result of the emission characteristic measuring unit from a prescribed emission characteristic and derives, based on the deviation, an amount of resin coating to be applied to the LED element; and a production unit that notifies the amount of resin coating to the second coating control unit to apply the amount of resin coating to the LED element.

An aspect of a method for resin coating according to the present invention includes applying, for emission characteristic measurement, resin containing phosphor to a trial coating material by a resin dispensing unit that dispenses the resin; placing the trial coating material with the trial coating of the resin into a trial coating material loading part; emitting excitation light for exciting the phosphor from a light source to the trial coating of the resin on the trial coating material in a state in which the trial coating material being measured is located by a clamp unit; measuring the emission characteristic of light emitted from the resin by the excitation light; determining a deviation of a measurement result in the emission characteristic measuring step from a prescribed emission characteristic and deriving, based on the deviation, an amount of resin coating to be applied for production to the LED element; and applying the amount of resin coating to the LED element by notifying the derived amount of resin coating to a coating control unit that controls the resin dispensing unit.

According to the present invention, in a state in which the clamp unit locates the trial coating material, the trial coating of the resin on the trial coating material is irradiated with excitation light and then light emitted from the phosphor contained in the resin is measured by the emission characteristic measuring unit. Thus, even if the trial coating material is curled, the resin to be measured is stably located, allowing correct measurement of chromaticity. Furthermore, a deviation of the measurement result of the emission characteristic measuring unit from the prescribed emission characteristic is determined, and then the amount of resin coating to be applied for actual production to the LED element is derived based on the deviation. Hence, even if LED elements are varied in emission wavelength, LED packages can have uniform emission characteristics with a higher production yield.

BRIEF DESCRIPTION OF THE DRAWINGS

FIG. 4 is an explanatory drawing of resin coating information according to the embodiment of the present invention;

FIG. 14A is an explanatory drawing of threshold values for Bin codes [1], [2], [3], [4], and [5] in the case where resin 8 has a phosphor concentration of 5% in the LED package production system according to the embodiment of the present invention;

FIG. 14B is an explanatory drawing of threshold values for the Bin codes [1], [2], [3], [4], and [5] in the case where the resin 8 has a phosphor concentration of 10% in the LED package production system according to the embodiment of the present invention;

FIG. 14C is an explanatory drawing of threshold values for the Bin codes [1], [2], [3], [4], and [5] in the case where the resin 8 has a phosphor concentration of 15% in the LED package production system according to the embodiment of the present invention;

FIG. 17A is an explanatory drawing of Bin codes for trial coating and actual amounts of resin coating according to the embodiment of the present invention;

FIG. 17B is an explanatory drawing showing emission characteristic measurement results of resin coating application according to the embodiment of the present invention;

FIG. 17C is a comparison between deviations and threshold values in resin coating application according to the embodiment of the present invention;

FIG. 17D is an explanatory drawing showing derivation of other amounts of resin coating according to the embodiment of the present invention;

DESCRIPTION OF THE EMBODIMENTS

The present invention will be described below with reference to embodiments.

First Embodiment

Figure 1:
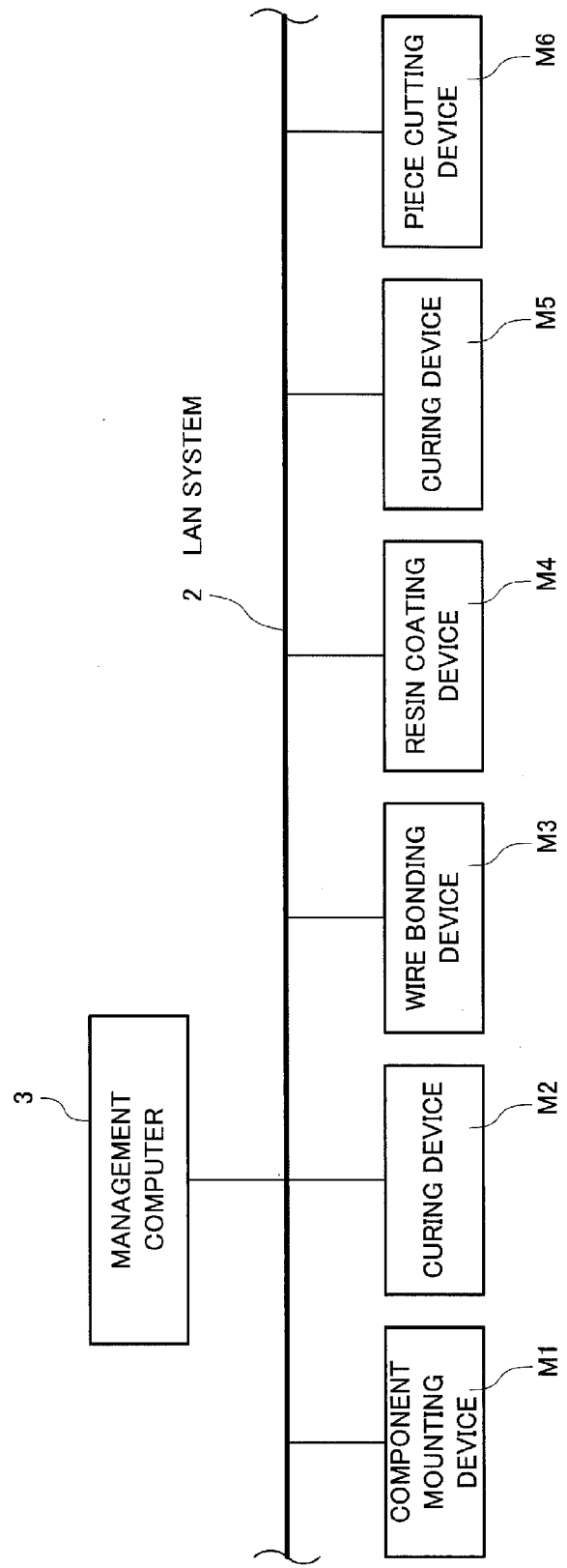
FIG. 1 is a structural diagram illustrating an LED package production system including a resin coating device according to an embodiment of the present invention.

Referring to FIG. 1, an LED package production system 1 will be first described below.

The LED package production system 1 has the function of producing an LED package in which an LED element mounted on a substrate is covered with resin containing phosphor. In the present embodiment, as shown in FIG. 1, a component mounting device M1, a curing device M2, a wire bonding device M3, a resin coating device M4, a curing device M5, and a piece cutting device M6 are connected via a LAN system 2. A management computer 3 controls these devices.

The component mounting device M1 mounts and bonds LED elements 5 with resin adhesive on a substrate 4 (see FIGS. 2A and 2B) serving as a base of the LED package.

The curing device M2 heats the substrate 4 after the LED elements 5 are mounted, thereby curing the resin adhesive used for bonding in the mounting process.

The wire bonding device M3 connects the electrodes of the substrate 4 and the electrodes of the LED elements 5 by bonding wires.

The resin coating device M4 applies resin containing phosphor to each of the LED elements 5 on the substrate 4 after wire bonding.

The curing device M5 heats the substrate 4 after the resin is applied, thereby curing the resin covering the LED elements 5.

The piece cutting device M6 cuts the substrate 4 for each of the LED elements 5 after the resin is cured, dividing the substrate 4 into the LED packages. Thus, the individual LED packages are completed.

FIG. 1 shows an example of a manufacturing line configuration in which the component mounting device M1 to the piece cutting device M6 are arranged in series. The LED package production system 1 does not always need to have such a line configuration. The devices for sequentially performing the steps may be arranged in a dispersed manner as long as information is properly transmitted as will be discussed below.

Around the wire bonding device M3, a plasma processing device may be disposed that performs plasma processing for cleaning the electrodes prior to wire bonding, or a plasma processing device may be disposed that performs plasma processing after wire bonding to perform surface modification for improving resin adhesion prior to resin coating.

Referring to FIGS. 2A, 2B, and 3(a) to 3(d), the substrate 4, the LED element 5, and an LED package 50 as a finished product will be described below. The substrate 4, the LED element 5, and the LED package 50 are subjects to be worked in the LED package production system 1.

Figure 2A:
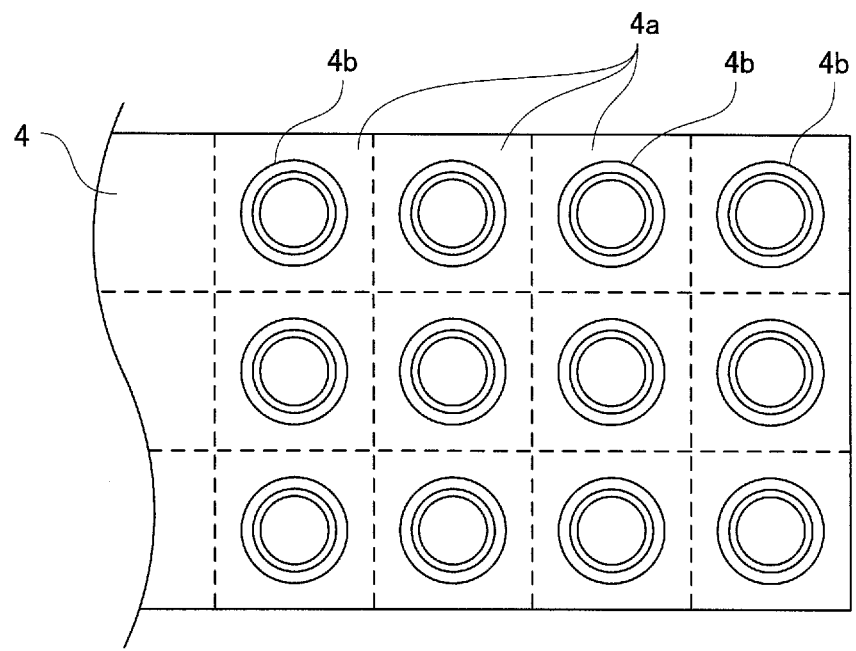
FIG. 2A is a plan view illustrating an LED package produced by the LED package production system according to the embodiment of the present invention.

As shown in FIG. 2A, the substrate 4 is a multiple-piece substrate including multiple single-piece substrates 4a, each serving as a base of the finished LED package 50. In each of the single-piece substrates 4a, an LED mounting part 4b for mounting the LED element 5 is formed. In each of the single-piece substrates 4a, the LED element 5 is mounted in the LED mounting part 4b, and then resin 8 is applied over the LED element 5 in the LED mounting part 4b. After the resin 8 is cured, the completed substrate 4 is cut for each of the single-piece substrates 4a, completing the LED package 50 illustrated in FIG. 2B.

Figure 2B:
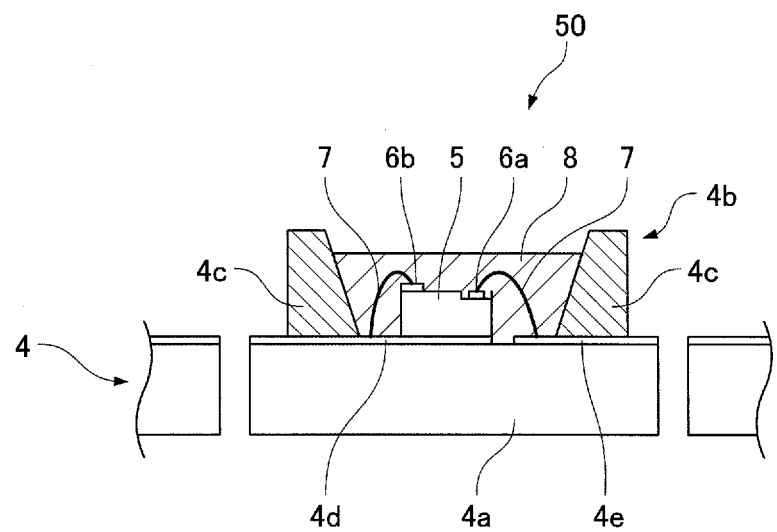
FIG. 2B is a cross-sectional view illustrating the LED package produced by the LED package production system according to the embodiment of the present invention.

The LED package 50 has the function of emitting white light as a light source for various illumination systems. Pseudo white light is obtained by combining the LED element 5, which is a blue LED, and the resin 8 containing phosphor exhibiting fluorescent yellow that is complementary to blue. As illustrated in FIG. 2B, a cavity-shaped reflective part 4c forming the LED mounting part 4b is provided on the single-piece substrate 4a. The reflective part 4c has a circular bank shaped like a ring or an oval. An N-type electrode 6a and a P-type electrode 6b of the LED element 5 mounted in the reflective part 4c are connected via bonding wires 7 to wiring layers 4e and 4d formed on the top surface of the single-piece substrate 4a. The LED element 5 in this state is covered with the resin 8 having a predetermined thickness in the reflective part 4c. When blue light emitted from the LED element 5 passes through the resin 8, the blue light is mixed with yellow light emitted from the phosphor contained in the resin 8, so that the mixed light is emitted as white light.

As illustrated in FIG. 3(a), in the LED element 5, an N-type semiconductor 5b and a P-type semiconductor 5c are deposited on a sapphire substrate 5a and the surface of the P-type semiconductor 5c is covered with a transparent electrode 5d. The N-type electrode 6a and the P-type electrode 6b for external connection are formed on the N-type semiconductor 5b and the P-type semiconductor 5c, respectively.

As shown in FIG. 3(b), the LED elements 5 are removed from LED wafers 10 that have been simultaneously formed and then bonded separately to a base sheet 10a. The LED elements 5 separately divided from the wafers inevitably vary in emission characteristics, e.g., an emission wavelength due to various error factors in the production process, e.g., uneven compositions in the film formation of the wafer. The LED elements 5 mounted on the substrate 4 as they are cause variations in the emission characteristics of the LED packages 50.

In order to prevent quality deterioration caused by variations in emission characteristics, in the present embodiment, the emission characteristics of the LED elements 5 produced in the same production process are measured beforehand, element characteristic information is prepared in which the LED elements 5 are associated with data on the emission characteristics of the LED elements 5, and a proper amount of the resin 8 is applied according to the emission characteristic of each of the LED elements. For the application of the proper amount of the resin 8, resin coating information is prepared beforehand, which will be described later.

First, the element characteristic information will be described below.

Figure 3:
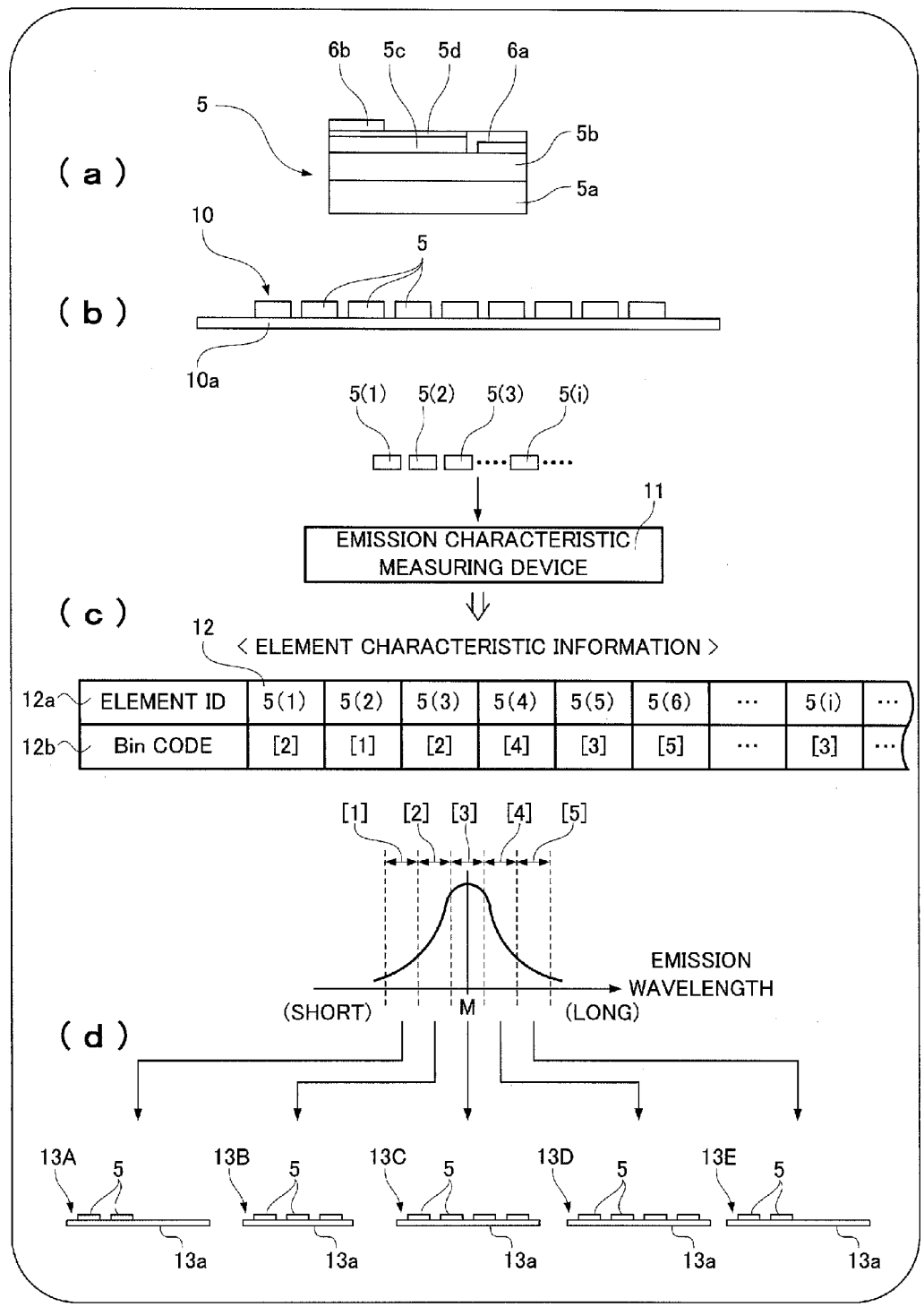
FIG. 3(a) is an enlarged cross-sectional view illustrating an LED element used in the LED package production system according to the embodiment of the present invention.
FIG. 3(b) is a side view of an LED wafer.
FIG. 3(c) is an explanatory drawing of element characteristic information.
FIG. 3(d) is an explanatory drawing of LED sheets sorted according to the element characteristic information.

As shown in FIG. 3(*c*), the LED elements 5 removed from the LED wafers 10 are identified by element IDs that identify the LED elements 5 (in this case, the LED elements 5 are identified by serial numbers (i) on the LED wafers 10), and then the LED elements 5 are sequentially placed into an emission characteristic measuring device 11.

The element IDs may have other data formats as long as each of the LED elements 5 can be identified. For example, matrix coordinates indicating the array of the LED elements 5 on the LED wafers 10 may be used as they are. The element IDs in such a format allow the LED elements 5 on the LED wafers 10 to be supplied in the component mounting device M1, which will be described later.

In the emission characteristic measuring device 11, power is supplied to the LED element 5 through a probe to emit actual light from the LED element 5, and then spectrum analysis is conducted on the light to perform measurements on predetermined items such as an emission wavelength and emission intensity. For the LED elements 5 to be measured, standard distribution of emission wavelengths is prepared beforehand as reference data. Furthermore, a wavelength range corresponding to a standard range in the distribution is divided into multiple wavelength regions, so that the LED elements to be measured are ranked by emission wavelength.

In this case, five ranks set by dividing the wavelength range are identified by Bin codes [1], [2], [3], [4], and [5] from the low-wavelength side. Element characteristic information 12 is created with a data structure in which element IDs 12*a* are associated with Bin codes 12*b*.

Specifically, the element characteristic information 12 is obtained by separately measuring emission characteristics, e.g., the emission wavelengths of the LED elements 5 beforehand. The element characteristic information 12 is prepared beforehand by LED element manufacturers and is transmitted to the LED package production system 1. The element characteristic information 12 recorded on a single recording medium may be transmitted or the element characteristic information 12 may be transmitted to the management computer 3 via the LAN system 2. In either case, the transmitted element characteristic information 12 is stored in the management computer 3 and is provided for the component mounting device M1 when necessary.

After the emission characteristic measurement, as shown in FIG. 3(*d*), the LED elements 5 are sorted and classified as five types according to the characteristic ranks, and then the LED elements 5 are separately bonded to five adhesive sheets 13*a*. Thus, five kinds of LED sheets 13A, 13B, 13C, 13D, and 13E are prepared such that the LED elements 5 of the Bin codes [1], [2], [3], [4], and [5] are bonded on the respective adhesive sheets 13*a*. When the LED elements 5 are mounted on the single-piece substrates 4*a* of the substrate 4, the ranked LED elements 5 on the LED sheets 13A, 13B, 13C, 13D, and 13E are supplied to the component mounting device M1. At this point, the LED sheets 13A, 13B, 13C, 13D, and 13E are each provided with the element characteristic information 12 from the management computer 3, the element characteristic information 12 indicating the Bin codes [1], [2], [3], [4], and [5] of the LED elements 5 held on the LED sheets.

Referring to FIG. 4, the resin coating information prepared beforehand for the element characteristic information 12 will be described below.

In the LED package 50 that obtains white light by a combination of a blue LED and YAG phosphor, the amount of phosphor particles in the concave LED mounting part 4*b* bearing the LED element 5 is an important factor for obtaining the normal emission characteristics of the product LED package 50, because of additive color mixture of blue light emitted from the LED element 5 and yellow light emitted by phosphor excited by the blue light.

As has been discussed, the LED elements 5 to be simultaneously worked vary in emission wavelength according to the Bin codes [1], [2], [3], [4], and [5]. Thus, a proper amount of phosphor particles in the resin 8 covering the LED element 5 varies according to the Bin codes [1], [2], [3], [4], and [5].

In resin coating information 14 prepared according to the present embodiment, as shown in FIG. 4, a proper coating amount of the resin 8, which is silicone resin or epoxy resin containing YAG phosphor particles, is specified beforehand in nanoliters according to Bin codes 17. Specifically, the resin 8 covering the LED element 5 is precisely applied according to a proper resin coating amount of the resin coating information 14, allowing the resin covering the LED element 5 to contain a proper amount of phosphor particles. Thus, a normal emission wavelength required for a finished product can be obtained after the resin is cured by heat.

As shown in phosphor concentration 16, multiple phosphor concentrations are set as the concentrations of phosphor particles in the resin 8 (three concentrations are set: D1(5%), D2(10%), and D3(15%)). A proper coating amount of the resin 8 is used according to the used phosphor concentration of the resin 8.

Specifically, in the case where the resin containing a phosphor concentration of D1 is applied, proper resin coating amounts VA0, VB0, VC0, VD0, and VE0 (proper resin coating amount 15(1)) of the resin 8 are applied for the respective Bin codes [1], [2], [3], [4], and [5]. Similarly, in the case where the resin containing a phosphor concentration of D2 is applied, proper resin coating amounts VF0, VG0, VH0, VJ0, and VK0 (proper resin coating amount 15(2)) of the resin 8 are applied for the respective Bin codes [1], [2], [3], [4], and [5]. In the case where the resin containing a phosphor concentration of D3 is applied, proper resin coating amounts VL0, VM0, VN0, VP0, and VR0 (proper resin coating amount 15(3)) of the resin 8 are applied for the respective Bin codes [1], [2], [3], [4], and [5]. The proper resin coating amounts are set for the respective phosphor concentrations because it is more preferable to apply the resin 8 having an optimum phosphor concentration according to variations in emission wavelength, in view of quality assurance.

Figure 5A:
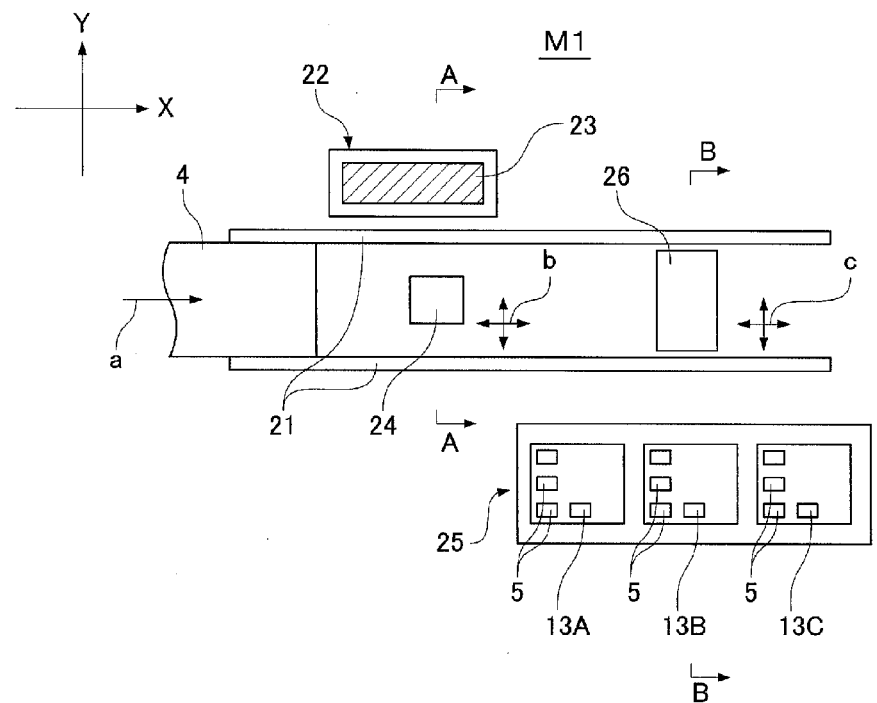
FIG. 5A is a plan view illustrating a component mounting device according to the embodiment of the present invention.
Figure 5B:
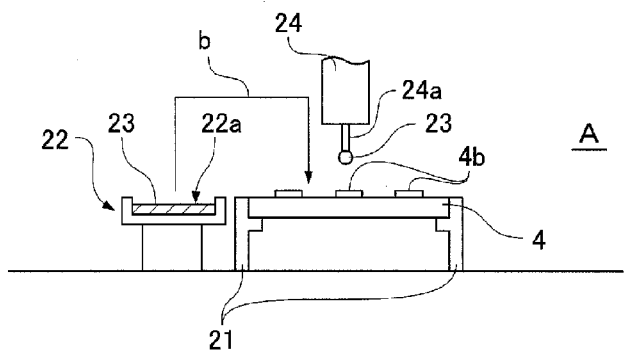
FIG. 5B is a sectional view taken along the line A-A of FIG. 5A.
Figure 5C:
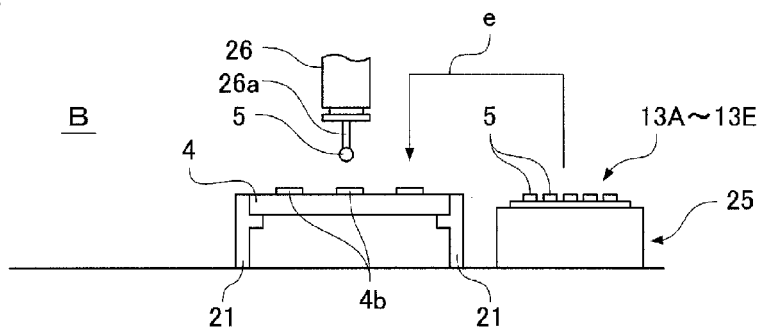
FIG. 5C is a cross-sectional view taken along the line B-B of FIG. 5A.

Referring to FIGS. 5A, 5B, and 5C, the configuration and functions of the component mounting device M1 will be described below.

As shown in the plan view of FIG. 5A, the component mounting device M1 includes a substrate transport mechanism 21 that transports the target substrate 4 from the upstream side in a substrate transport direction (arrow a). The substrate transport mechanism 21 has an adhesive coating part A illustrated in the section A-A of FIG. 5B and a component mounting part B illustrated in the section B-B of FIG. 5C. The adhesive coating part A and the component amounting part B are sequentially arranged from the upstream side.

The adhesive coating part A includes an adhesive supply unit 22 that is disposed on a side of the substrate transport mechanism 21 to supply resin adhesive 23 having a predetermined thickness and an adhesive transfer mechanism 24 that is horizontally (arrow b) movable above the substrate transport mechanism 21 and the adhesive supply unit 22.

The component mounting part B includes a component supply mechanism 25 that is disposed on a side of the substrate transport mechanism 21 to hold the LED sheets 13A, 13B, 13C, 13D, and 13E illustrated in FIG. 3(d) and a component mounting mechanism 26 that is horizontally (arrow c) movable above the substrate transport mechanism 21 and the component supply mechanism 25.

As illustrated in FIG. 5B, the substrate 4 transported into the substrate transport mechanism 21 is located at the adhesive coating part A, and the resin adhesive 23 is applied to the LED mounting parts 4b formed on the single-piece substrates 4a.

Specifically, first, the adhesive transfer mechanism 24 is moved over the adhesive supply unit 22 to bring a transfer pin 24a into contact with the coating of the resin adhesive 23 formed on a transfer surface 22a, and the resin adhesive 23 is attached to the transfer pin 24a. Moreover, the adhesive transfer mechanism 24 is moved above the substrate 4, and then the transfer pin 24a is moved down to the LED mounting part 4b (arrow d). This allows the resin adhesive 23 attached to the transfer pin 24a to be supplied by transfer to an element mounting position in the LED mounting part 4b.

The substrate 4 coated with the adhesive is transported downstream and is located at the component mounting part B as shown in FIG. 5C. The LED elements 5 are then mounted in the LED mounting parts 4b coated with the adhesive.

Specifically, the component mounting mechanism 26 is first moved above the component supply mechanism 25 and then a mounting nozzle 26a is moved down to one of the LED sheets 13A, 13B, 13C, 13D, and 13E held on the component supply mechanism 25, so that the LED element 5 is held and removed by the mounting nozzle 26a. Moreover, the component mounting mechanism 26 is moved above the LED mounting part 4b of the substrate 4 and then the mounting nozzle 26a is moved down (arrow e), allowing the LED element 5 held on the mounting nozzle 26a to be mounted at an element mounting position coated with the adhesive in the LED mounting part 4b.

In the mounting of the LED elements 5 on the substrate 4 by the component mounting device M1, an element mounting program is preset, that is, the LED elements 5 are removed from one of the LED sheets 13A, 13B, 13C, 13D, and 13E in a preset order before being mounted on the single-piece substrates 4a of the substrate 4 in individual mounting operations performed by the component mounting mechanism 26. Components are mounted according to the element mounting program.

In the mounting of components, mounting position information 71a (see FIG. 11) is extracted and recorded from work history. The mounting position information 71a indicates which ones of the single-piece substrates 4a of the substrate 4 bear the mounted LED elements 5. Moreover, the mounting position information 71a is associated with the element characteristic information 12, which indicates correspondences between the LED elements 5 mounted on the single-piece substrates 4a and the characteristic ranks (Bin codes [1], [2], [3], [4], and [5]), by a mapping unit 74 (see FIG. 11), thereby creating map data 18 shown in FIG. 6.

Figure 6:
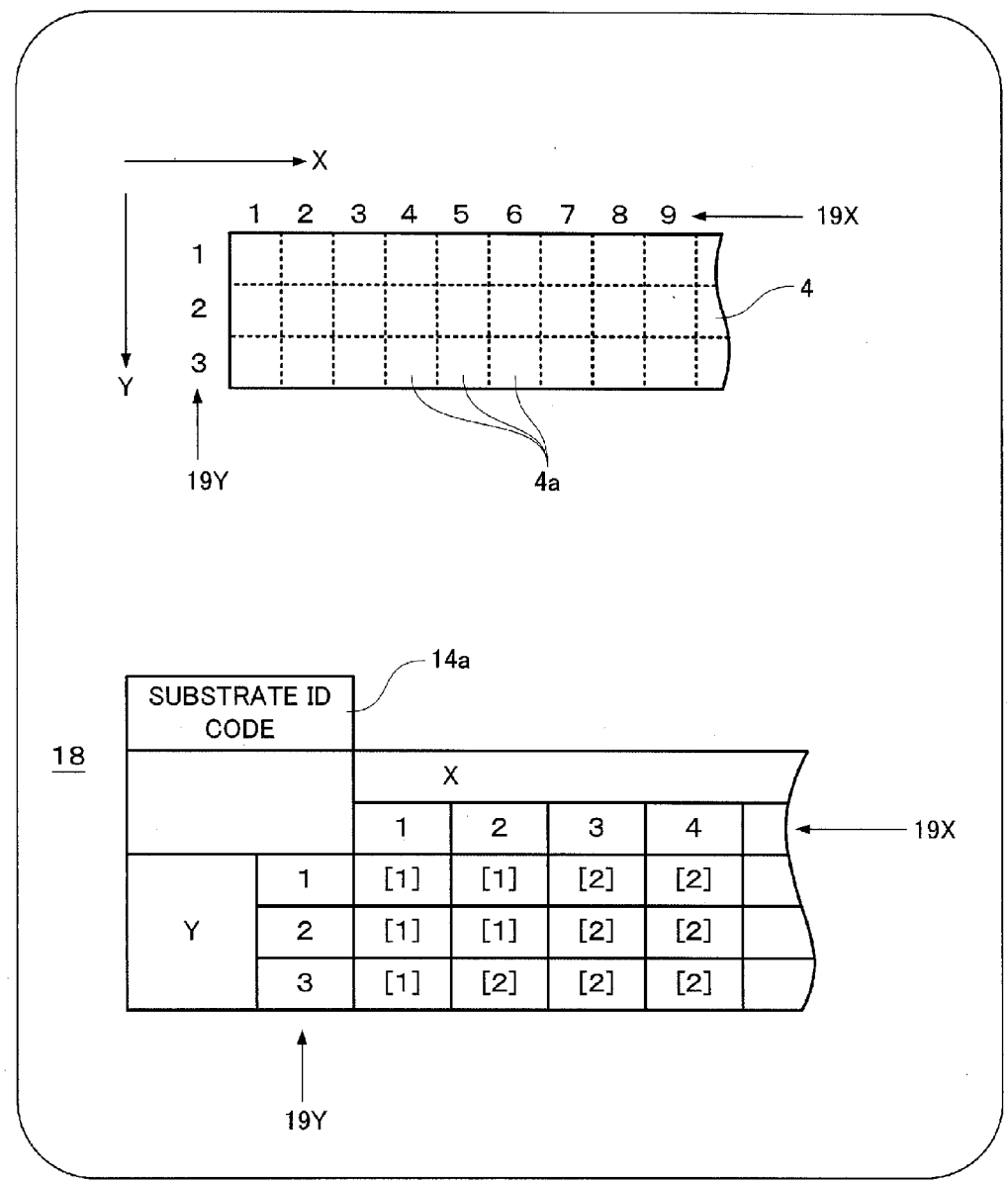
FIG. 6 is an explanatory drawing of map data used in the LED package production system according to the embodiment of the present invention.

In FIG. 6, the positions of the single-piece substrates 4a of the substrate 4 are specified by combinations of matrix coordinates 19X and 19Y that indicate positions in X and Y directions, respectively. The individual cells of a matrix containing the matrix coordinates 19X and 19Y are associated with the Bin codes of the LED elements 5 mounted on the corresponding positions, thereby creating the map data 18 in which the mounting position information 71a indicating the positions of the LED elements 5 mounted on the substrate 4 by the component mounting device M1 is associated with the element characteristic information 12 on the LED elements 5.

In other words, the component mounting device M1 includes the mapping unit 74 that creates the map data 18 for each of the substrates 4. In the map data 18, the mounting position information indicating the positions of the LED elements 5 mounted on the substrate 4 by the component mounting device M1 is associated with the element characteristic information 12 on the LED elements 5. The created map data 18 is transmitted as feedforward data to the resin coating device M4, which will be described below, via the LAN system 2.

Referring to FIGS. 7A, 7B, and 8A to 8C, the configuration and functions of the resin coating device M4 will be described below.

The resin coating device M4 has the function of applying the resin 8 over the LED elements 5 mounted on the substrate 4 by the component mounting device M1. As shown in the plan view of FIG. 7A, the resin coating device M4 has a resin coating part C, which is illustrated in the C-C section of FIG. 7B, into a substrate transport mechanism 31 that transports the target substrate 4 from the upstream side in a substrate transport direction (arrow f). The resin coating part C has a resin dispenser head 32 that dispenses the resin 8 from a dispenser nozzle 33a attached to the lower end of the head.

Figure 7A:
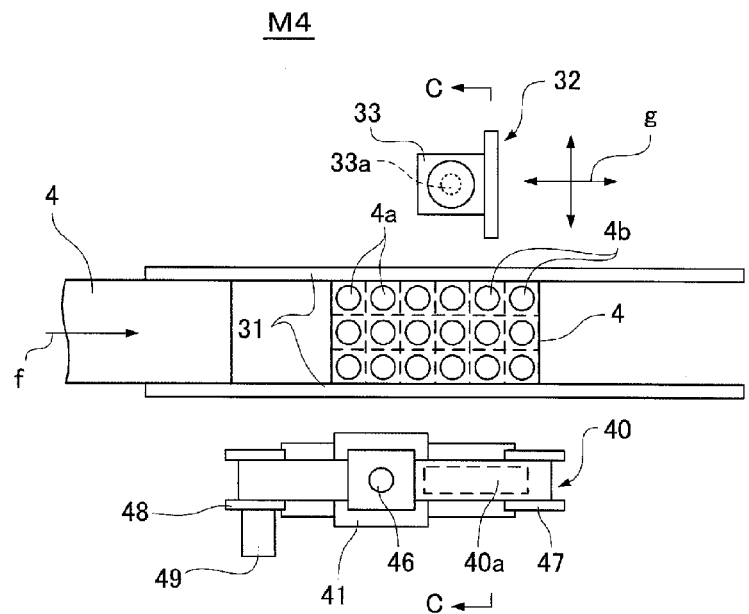
FIG. 7A is a plan view illustrating the resin coating device according to the embodiment of the present invention.
Figure 7B:
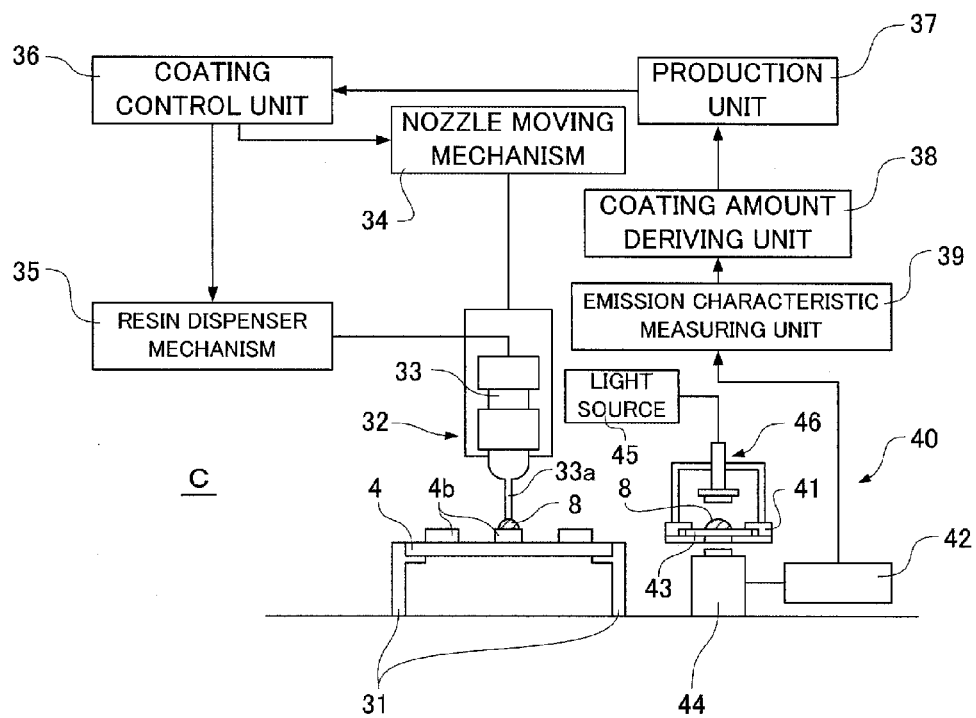
FIG. 7B is an explanatory drawing of the functions of the resin coating device illustrated in FIG. 7A.

As shown in FIG. 7B, the resin dispenser head 32 is driven by a nozzle moving mechanism 34. The nozzle moving mechanism 34 is controlled by a coating control unit 36 to make a horizontal movement (arrow g in FIG. 7A) and a vertical movement. The resin 8 is supplied into the resin dispenser head 32 while being stored in a syringe attached to a dispenser 33. A resin dispenser mechanism 35 applies an air pressure into the dispenser 33, allowing the resin 8 in the dispenser 33 to be dispensed through the dispenser nozzle 33a to the LED mounting parts 4b formed on the substrate 4. At this point, the resin dispenser mechanism 35 is controlled by the coating control unit 36, thereby optionally controlling the amount of the dispensed resin 8. In other words, the resin coating part C has the function of applying the resin 8 to any coating position while varying the amount of coating of the resin 8.

For the resin dispenser mechanism 35, various liquid dispensing systems, e.g., a plunger system using a mechanical cylinder and a screw pump system are applicable in addition to the air-pressure dispenser 33.

On a side of the substrate transport mechanism 31, a trial coating/measuring unit 40 is disposed in the moving range of the resin dispenser head 32. The trial coating/measuring unit 40 has the function of deciding whether the amount of the applied resin 8 is proper or not by measuring the emission characteristic of a trial coating of the resin 8 before the resin 8 is applied for actual production to the LED mounting part 4b of the substrate 4. "Trial coating" may be called "trial".

To be specific, a translucent trial coating material 43 on which a trial coating of the resin 8 has been applied by the resin coating part C is irradiated with light emitted from a light source 45 for measurement. At this point, the emission characteristic of the trial coating is measured by an emission characteristic measuring module including a spectroscope 42 and an emission characteristic measuring unit 39, and then the measurement result is compared with a preset threshold value. Thus, it is decided whether the set amount of resin coating in the resin coating information 14 in FIG. 4 is proper or not.

The composition and property of the resin 8 containing phosphor particles are not always stable. Even if a proper amount of resin coating is preset in the resin coating information 14, a phosphor concentration and the viscosity of resin inevitably vary with the passage of time.

Hence, even if the resin 8 is dispensed according to a dispensing parameter corresponding to the preset proper amount of coating, the amount of resin coating may be deviated from the set proper value. Furthermore, even in the case of the proper amount of coating, the amount of phosphor particles to be supplied varies due to fluctuations in concentration.

In order to avoid such an inconvenience, in the present embodiment, a trial coating is applied by the resin coating device M4 to check whether or not a proper amount of phosphor particles is supplied at predetermined intervals. Moreover, the emission characteristic of the trial resin coating is measured to stabilize the amount of supplied phosphor particles in accordance with ideal emission characteristics.

The resin coating part C provided in the resin coating device M4 according to the present embodiment has the functions of coating application for measurement and coating application for production. In the coating application for measurement, a trial coating of the resin 8 for emission characteristic measurement is applied to the trial coating material 43. In the coating application for production, the resin 8 is applied for actual production to the LED elements 5 mounted on the substrate 4. The coating application for measurement and the coating application for production are performed by controlling the resin coating part C by means of the coating control unit 36. The coating application for measurement and the coating application for production may be controlled by two different coating control units.

Figure 8A:
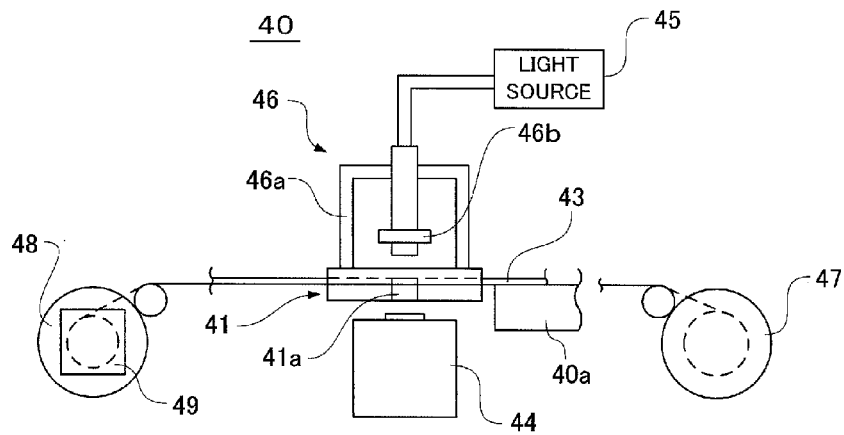
FIG. 8A is a front view illustrating a trial coating/measuring unit included in the resin coating device according to the embodiment of the present invention.
Figure 8B:
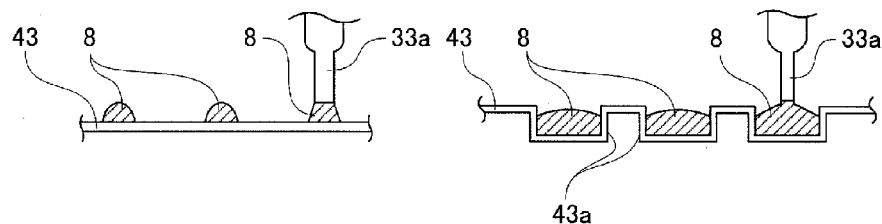
FIG. 8B is a cross-sectional view illustrating a trial coating material of FIG. 8A and a trial resin coating on the trial coating material.
Figure 8C:
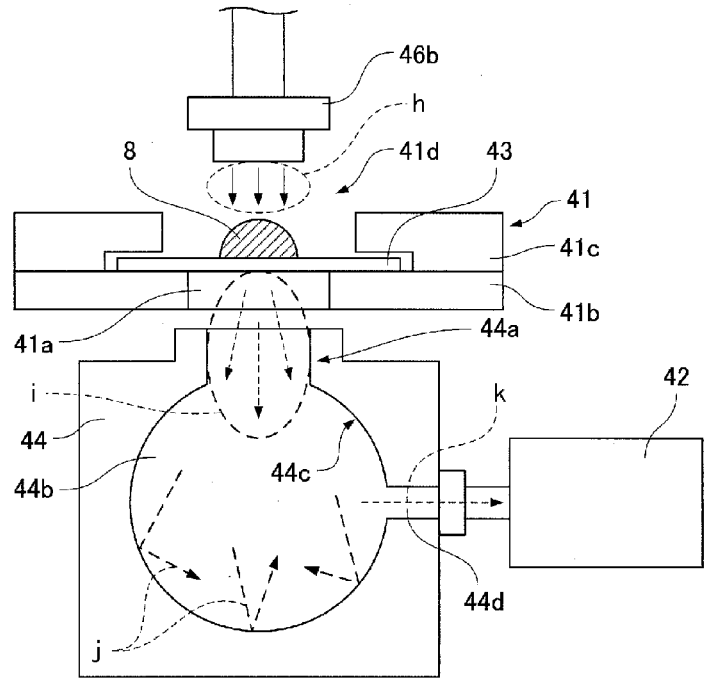
FIG. 8C is a cross-sectional view showing an emission characteristic test on the trial resin coating located at a measurement point.
Figure 9A:
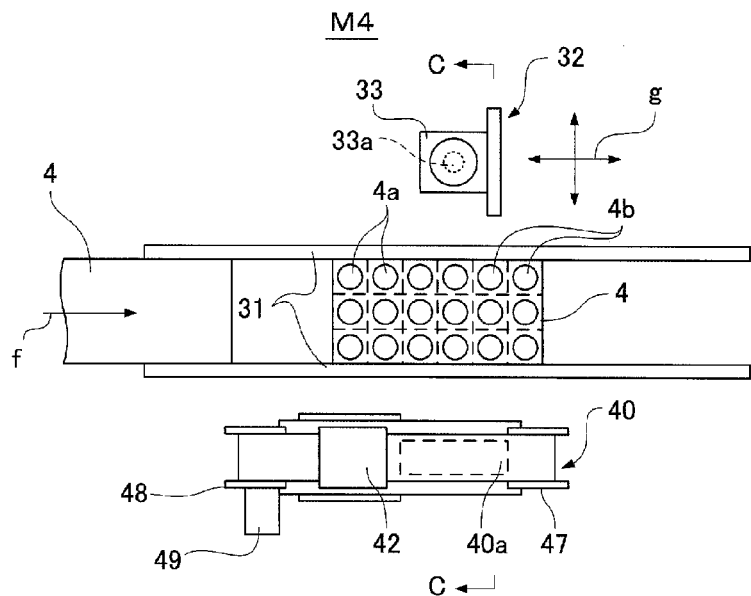
FIG. 9A is a plan view illustrating the resin coating device in the LED package production system according to the embodiment of the present invention.
Figure 9B:
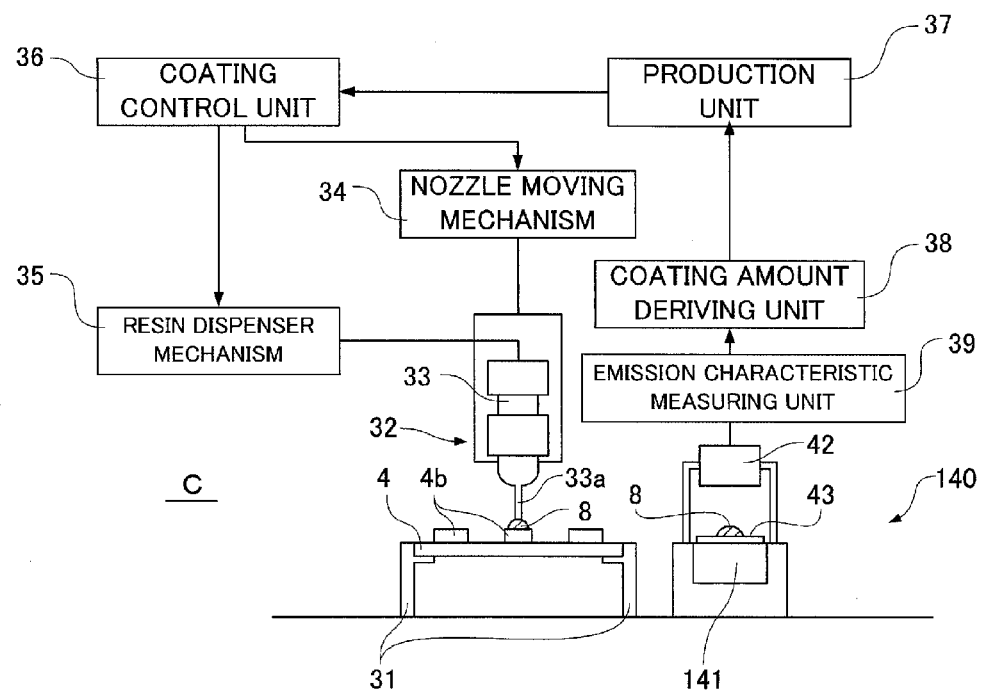
FIG. 9B is an explanatory drawing of the functions of the resin coating device illustrated in FIG. 9A.

Referring to FIGS. 8A to 8C, the detailed configuration of the trial coating/measuring unit 40 will be described below.

As illustrated in FIG. 8A, the stored trial coating material 43 is wound around a supply reel 47. The trial coating material 43 is fed along the top surface of a trial coating stage 40a, is transferred between a trial coating material loading part 41 and an irradiation part 46, and is wound around a take-up reel 48 driven by a winding motor 49.

Mechanisms for collecting the trial coating material 43 include a feeding mechanism for feeding the trial coating material 43 into a collection box, in addition to various methods including winding around the take-up reel 48.

The irradiation part 46 has the function of irradiating the trial coating material 43 with excitation light emitted from the light source 45. The excitation light emitted from a white-light or blue-light LED of the light source 45 is guided into a light-shielding box 46a, which has a simple dark box function, through a light-focusing tool 46b for guiding light through a fiber cable.

The light source 45 has the function of emitting excitation light that excites phosphor contained in the resin 8. In the present embodiment, the light source 45 is disposed above the trial coating material loading part 41 to irradiate the trial coating material 43 with measuring light from above through the light-focusing tool 46b.

The trial coating material 43 is a tape material that is a transparent flat resin sheet having a predetermined width or an emboss-type sheet that has embossed portions 43a on the underside of a similar tape material, the embossed portions 43a being aligned with the concave portions of the LED package 50 (see FIG. 8B).

When the trial coating material 43 is fed on the trial coating/measuring unit 40, a trial coating of the resin 8 is applied to the trial coating material 43 by the resin dispenser head 32. As shown in FIG. 8B, the trial coating is applied by dispensing the specified amount of the resin 8 to the trial coating material 43 through the dispenser nozzle 33a while the underside of the trial coating material 43 is supported by the trial coating stage 40a.

(b1) in FIG. 8B illustrates a state in which the proper set amount of the resin 8 is applied to the trial coating material 43 composed of the tape material, the set amount being specified in the resin coating information 14. The applied resin 8 is circular in plan view.

(b2) in FIG. 8B illustrates a state in which the proper set amount of the resin 8 is applied into each of the embossed portions 43a of the emboss-type trial coating material 43. As will be described later, the resin 8 applied on the trial coating stage 40a is a trial coating for demonstratively deciding whether or not a proper amount of phosphor is supplied to the target LED element 5. Thus, in the case where the resin 8 is sequentially applied to multiple points on the trial coating material 43 by the same trial coating operation of the resin dispenser head 32, the amount of coating is varied in stages based on known data about correlations between emission characteristic measured values and amounts of coating.

After the trial coating of the resin 8 is applied, the trial coating material 43 guided into the light-shielding box 46a is irradiated with white light emitted from above from the light source 45 through the light-focusing tool 46b. The light having passed through the resin 8 applied to the trial coating material 43 is received by an integrating sphere 44, which is disposed under the trial coating material loading part 41, through a light passage opening 41a provided on the trial coating material loading part 41.

FIG. 8C illustrates the structures of the trial coating material loading part 41 and the integrating sphere 44.

The trial coating material loading part 41 includes an upper guide member 41c attached on the top surface of a lower support member 41b supporting the underside of the trial coating material 43. The upper guide member 41c has the function of guiding both end faces of the trial coating material 43.

The trial coating material loading part 41 has the functions of guiding the trial coating material 43 transported into the trial coating/measuring unit 40, and loading the trial coating material 43 at a fixed position after the trial coating of the resin 8 is applied in the coating application for measurement.

The integrating sphere 44 has the function of condensing light emitted from the light-focusing tool 46b (arrow h) through the resin 8 and guiding the light to the spectroscope 42. Specifically, the integrating sphere 44 has a spherical reflective surface 44c that is an inner spherical surface. Light (arrow i) transmitted from an opening 44a provided directly under the light passage opening 41a enters a reflection space 44b from the opening 44a provided at the top of the integrating sphere 44, is collected as a measuring beam (arrow k) from an output part 44d in the process of total reflection (arrow j) repeated on the spherical reflective surface 44c, and then is received by the spectroscope 42.

In this configuration, the trial coating of the resin 8 on the trial coating material 43 is irradiated with white light emitted from an LED package used for the light source 45. In this process, blue light components contained in white light excite phosphor in the resin 8 to emit yellow light. White light obtained by additive color mixture of yellow light and blue light is emitted upward from the resin 8 and is received by the spectroscope 42 through the integrating sphere 44.

As shown in FIG. 7B, the received white light is analyzed by the emission characteristic measuring unit 39 to measure the emission characteristic. In this case, an emission characteristic of the white light, e.g., a color rank or a luminous flux is inspected, and a deviation from a specified emission characteristic is detected as a test result. The integrating sphere 44, the spectroscope 42, and the emission characteristic measuring unit 39 constitute the emission characteristic measuring module in which light is emitted from the resin 8 by irradiation of excitation light (in this case, white light emitted by a white LED) from above by the light source 45 to the resin 8 applied to the trial coating material 43, and then the light is received by the spectroscope 42 through the integrating sphere 44 under the trial coating material 43 to measure the emission characteristic of the light emitted from the resin 8.

The emission characteristic measuring module configured thus can obtain the following effect: the trial coating of the resin 8 on the trial coating material 43 illustrated in FIG. 8B has its underside always in contact with the top surface of the trial coating material 43 or the bottoms of the embossed portions 43a, and thus the underside of the resin 8 is always located at a reference height specified by the trial coating, material 43, keeping a constant height difference between the underside of the resin 8 and the opening 44a of the integrating sphere 44. In contrast, the top surface of the resin 8 is not always kept at a constant liquid level with an identical shape due to disturbance factors such as the coating conditions of the dispenser nozzle 33a, leading to irregular intervals between the top surface of the resin 8 and the light-focusing tool 46b.

Comparing stability of light emitted to the top surface of the resin 8 and stability of light transmitted from the underside of the resin 8, light emitted to the resin 8 passes through the light-focusing tool 46b and thus is highly focused, so that the influence of irregular intervals between the top surface of the resin 8 and the light-focusing tool 46b on light transmission is negligible. In contrast, light passing through the resin 8 is excitation light obtained by exciting phosphor in the resin 8 and thus is considerably scattered, causing irregular intervals between the underside of the resin 8 and the opening 44a to considerably affect the entry of light into the integrating sphere 44.

In the trial coating/measuring unit 40 according to the present embodiment, excitation light from the light source 45 is emitted to the resin 8 from above as in the foregoing configuration, so that light emitted from the resin 8 is received by the integrating sphere 44 from the underside of the trial coating material 43, enabling a stable decision on an emission characteristic. Furthermore, the integrating sphere 44 eliminates the need for a dark room structure in a light receiving part, thereby reducing the size of the device and the cost of equipment.

As illustrated in FIG. 7B, the measurement result of the emission characteristic measuring unit 39 is transmitted to a coating amount deriving unit 38. The coating amount deriving unit 38 determines a deviation of the measurement result of the emission characteristic measuring unit 39 from the prescribed emission characteristic and derives, based on the deviation, a proper amount of the resin 8 to be applied for actual production to the LED element 5. Another proper dispensing amount derived by the coating amount deriving unit 38 is transmitted to a production unit 37. The production unit 37 notifies the coating control unit 36 of the additionally derived proper amount of resin coating. The coating control unit 36 controls the nozzle moving mechanism 34 and the resin dispenser mechanism 35 in response to the derived amount and causes the resin dispenser head 32 to apply the proper amount of the resin 8 for production to the LED element 5 mounted on the substrate 4.

In this coating application for production, first, the proper amount of the resin 8 specified in the resin coating information 14 is actually applied, and then the emission characteristic of the resin 8 is measured in an uncured state. Based on the obtained measurement result, an acceptable range is set for the measured values of the emission characteristics of the resin 8 applied in the coating application for production, and the acceptable range is used as threshold values for determining the quality in the coating application for production (see threshold value data 81a in FIG. 11).

In other words, in the method for resin coating in the LED package production system according to the present embodiment, the light source 45 for measuring emission characteristics is a white LED, a prescribed emission characteristic for setting a threshold value for deciding quality in the coating application for production is determined by deviating the normal emission characteristic, which is determined for a completed product including the resin 8 applied in a cured state to the LED elements 5, by a difference from the emission characteristic of the resin 8 in an uncured state. Thus, the amount of resin coating in the process of applying resin to the LED elements 5 can be controlled based on the normal emission characteristic of a completed product.

In the present embodiment, the light source 45 is the LED package 50 that emits white light. Thus, the emission characteristic of the trial coating of the resin 8 can be measured by light having the same characteristic as excitation light emitted in the LED package 50 of a completed product, achieving a more reliable test result. The same LED package as in a completed product is not always necessary. In emission characteristic measurement, any light source devices (e.g., a blue LED that emits blue light or a blue laser light source) can be used for testing as long as blue light can be stably emitted with a constant wavelength. By using the LED package 50 that emits white light by means of a blue LED, an inexpensive light source device with stable quality can be advantageously selected. In this case, blue light having a predetermined wavelength may be extracted using a bandpass filter.

The trial coating/measuring unit 40 configured thus may be replaced with a trial coating/measuring unit 140 that is configured as illustrated in FIGS. 9A, 9B, 10A, and 10B. Specifically, the trial coating/measuring unit 140 has an external structure in which a cover unit 140b is disposed on a rectangular base unit 140a placed in a horizontal position. The cover unit 140b has an opening 140c that is opened and closed by a coating slide window 140d that is slidably provided (arrow I). The trial coating/measuring unit 140 contains a trial coating stage 145a that supports the trial coating material 43 from its underside, a trial coating material loading part 141 on which the trial coating material 43 is placed, and the spectroscope 42 provided above the trial coating material loading part 141.

The trial coating material loading part 141 includes a light source device that emits excitation light for exciting phosphor as in the light source 45 illustrated in FIG. 8A. In the coating application for measurement, the trial coating material 43 coated with the trial coating of the resin 8 is irradiated with excitation light from the underside from the light source device. As in the example of FIG. 8A, the stored trial coating material 43 is wound around the supply reel 47. The trial coating material 43 is fed along the top surface of the trial coating stage 145a (arrow m), is transferred between the trial coating material loading part 141 and the spectroscope 42, and is wound around the take-up reel 48 driven by the winding motor 49.

In a state in which the coating slide window 140d is opened in a sliding manner, the top surface of the trial coating stage 145a is exposed upward, allowing the resin dispenser head 32 to apply the trial coating of the resin 8 to the trial coating material 43 placed on the top surface of the trial coating stage 145a. The trial coating is applied by dispensing, as illustrated in FIG. 8B, the specified amount of the resin 8 to the trial coating material 43 through the dispenser nozzle 33*a* while the underside of the trial coating material 43 is supported by the trial coating stage 145*a*.

Figure 10A:
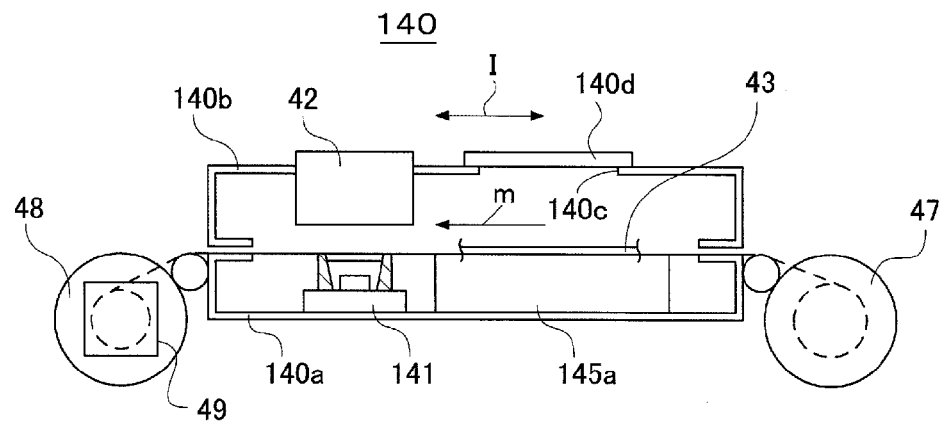
FIG. 10A is a front view illustrating a trial coating/measuring unit according to another embodiment.
Figure 10B:
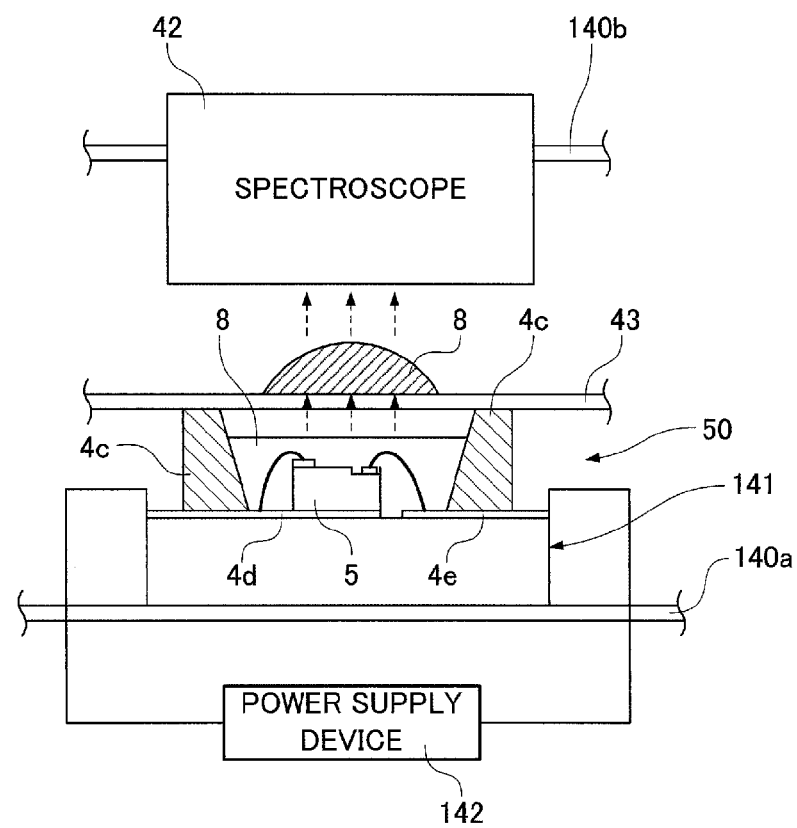
FIG. 10B is a cross-sectional view showing an emission characteristic test performed by the trial coating/measuring unit illustrated in FIG. 10A.

In FIG. 10B, the trial coating material 43 coated with the trial coating of the resin 8 is moved on the trial coating stage 145*a* to locate the resin 8 above the trial coating material loading part 141, and then the cover unit 140*b* is moved down to form a dark room for measuring an emission characteristic between the cover unit 140*b* and the base unit 140*a*. On the trial coating material loading part 141, the LED package 50 that emits white light is used as a light source device. In the LED package 50, the wiring layers 4*e* and 4*d* connected to the LED element 5 are connected to a power supply device 142. The power supply device 142 is turned on to supply power for light emission to the LED element 5, allowing the LED package 50 to emit white light.

The white light passes through the resin 8 and then strikes the trial coating of the resin 8 on the trial coating material 43. In this process, white light obtained by additive color mixture of blue light and yellow light is emitted upward from the resin 8, the yellow light being emitted by phosphor excited in the resin 8 by blue light contained in white light. The spectroscope 42 is disposed above the trial coating/measuring unit 140. White light emitted from the resin 8 is received by the spectroscope 42 and then is analyzed by the emission characteristic measuring unit 39 to measure the emission characteristic. In this case, the emission characteristic of white light, e.g., a color rank or a luminous flux is inspected, thereby detecting a deviation from the specified emission characteristic as a test result. In other words, the emission characteristic measuring unit 39 measures the emission characteristic of light emitted from the resin 8, the light being emitted by irradiation of excitation light from the LED element 5, which acts as a light source, to the resin 8 applied to the trial coating material 43. The measurement result of the emission characteristic measuring unit 39 is transmitted to the coating amount deriving unit 38 and undergoes the same processing as in the example of FIGS. 7A and 7B.

Figure 11:
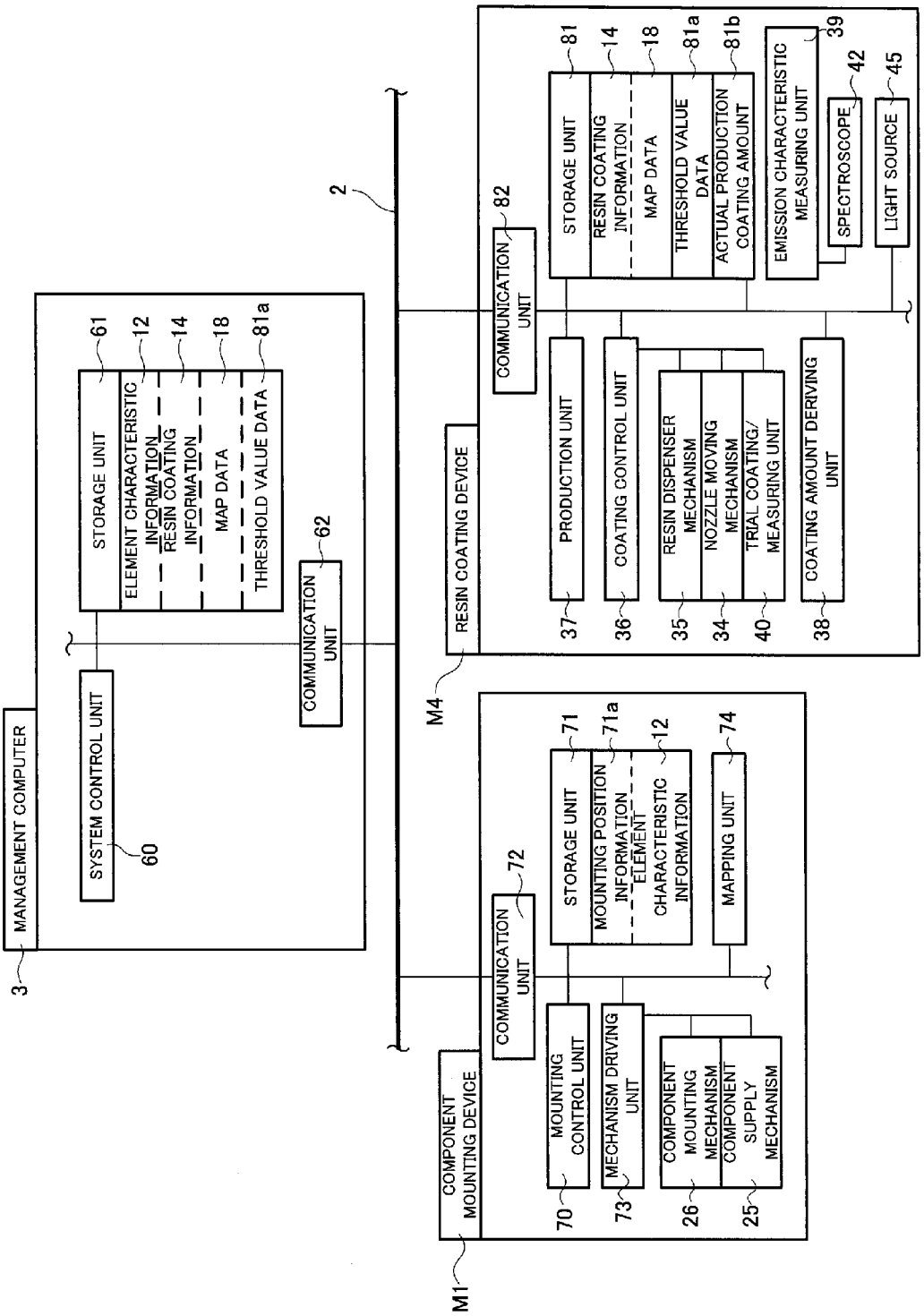
FIG. 11 is a structural diagram illustrating a control system for the LED package production system according to the embodiment of the present invention.

Referring to FIG. 11, the control system configuration of the LED package production system 1 will be described below.

Among the constituent elements of the devices constituting the LED package production system 1, the following will discuss the constituent elements relating to transmission/reception and updating of the element characteristic information 12, the resin coating information 14, the map data 18, and the threshold value data 81*a* in the management computer 3, the component mounting device M1, and the resin coating device M4.

In FIG. 11, the management computer 3 includes a system control unit 60, a storage unit 61, and a communication unit 62. The system control unit 60 controls LED package production performed by the LED package production system 1. The storage unit 61 stores the element characteristic information 12 and the resin coating information 14, in addition to programs and data required for the control of the system control unit 60. The storage unit 61 further stores the map data 18 and the threshold value data 81*a* if necessary. The communication unit 62 is connected to other devices via the LAN system 2 to transmit and receive a control signal and data. The element characteristic information 12 and the resin coating information 14 are transmitted from the outside and stored in the storage unit 61 through the LAN system 2 and the communication unit 62 or through separate storage media such as a CD-ROM, a USB memory storage, and an SD card.

The component mounting device M1 includes a mounting control unit 70, a storage unit 71, a communication unit 72, a mechanism driving unit 73, and the mapping unit 74. In order to allow the component mounting device M1 to perform a component mounting operation, the mounting control unit 70 controls the following units based on various kinds of programs and data in the storage unit 71. The storage unit 71 stores the mounting position information 71*a* and the element characteristic information 12 in addition to programs and data required for the control of the mounting control unit 70. The mounting position information 71*a* is created by history data on the mounting operation control of the mounting control unit 70. The element characteristic information 12 is transmitted from the management computer 3 through the LAN system 2. The communication unit 72 is connected to other devices via the LAN system 2 to transmit and receive the control signal and data.

The mechanism driving unit 73 is controlled by the mounting control unit 70 to drive the component supply mechanism 25 and the component mounting mechanism 26. Thus, the LED elements 5 are mounted on the respective single-piece substrates 4*a* of the substrate 4. The mapping unit 74 (map data creating unit) creates the map data 18 for each of the substrates 4 by associating the mounting position information 71*a*, which is stored in the storage unit 71 and indicates the position of the LED element 5 mounted on the substrate 4 by the component mounting device M1, with the element characteristic information 12 on the LED element 5. In other words, the map data creating unit is provided in the component mounting device M1, and the map data 18 is transmitted from the component mounting device M1 to the resin coating device M4. The map data 18 may be transmitted from the component mounting device M1 to the resin coating device M4 through the management computer 3. In this case, as shown in FIG. 11, the map data 18 is also stored in the storage unit 61 of the management computer 3.

The resin coating device M4 includes the coating control unit 36, a storage unit 81, a communication unit 82, the production unit 37, the coating amount deriving unit 38, and the emission characteristic measuring unit 39. The coating control unit 36 controls the nozzle moving mechanism 34, the resin dispenser mechanism 35, and the trial coating/measuring unit 40, which constitute the resin coating part C such that a coating for measurement, that is, a trial coating of the resin 8 for emission characteristic measurement is applied to the trial coating material 43 and a coating for production, that is, a coating of the resin 8 for actual production is applied to the LED element 5.

The storage unit 81 stores the resin coating information 14, the map data 18, the threshold value data 81*a*, and actual production coating amounts 81*b* in addition to programs and data required for the control of the coating control unit 36. The resin coating information 14 is transmitted from the management computer 3 through the LAN system 2, and the map data 18 is similarly transmitted from the component mounting device M1 through the LAN system 2. The communication unit 82 is connected to other devices via the LAN system 2 to transmit and receive the control signal and data.

The emission characteristic measuring unit 39 measures the emission characteristic of light that is emitted from the resin 8 by irradiation of excitation light from the light source 45 onto the resin 8 applied to the trial coating material 43. The coating amount deriving unit 38 determines a deviation of the measurement result of the emission characteristic measuring unit 39 from the prescribed emission characteristic, and performs an operation for deriving a proper amount of the resin 8 to be applied for actual production to the LED element 5, based on the deviation. The production unit 37 then notifies the coating control unit 36 of the proper amount of resin coating that is derived by the coating amount deriving unit 38, enabling coating application for production by applying the proper amount of resin coating to the LED element 5.

In the configuration of FIG. 11, functions other than functions for operations specific to the devices are not always necessary. For example, the component mounting device M1 does not always need to have the function of the mapping unit 74, and the resin coating device M4 does not always need to have the function of the coating amount deriving unit 38. For example, the functions of the mapping unit 74 and the coating amount deriving unit 38 may be replaced with the arithmetic function of the system control unit 60 of the management computer 3 so as to transmit and receive necessary signals through the LAN system 2.

In the configuration of the LED package production system 1, the component mounting device M1 and the resin coating device M4 are both connected to the LAN system 2. The management computer 3, in which the storage unit 61 stores the element characteristic information 12, and the LAN system 2 act as element characteristic information providing devices that provide the component mounting device M1 with information obtained as the element characteristic information 12 by separately measuring the emission characteristics such as the emission wavelengths of the LED elements 5 beforehand. Similarly, the management computer 3, in which the storage unit 61 stores the resin coating information 14, and the LAN system 2 act as resin information providing devices that provide the resin coating device M4 with information obtained as resin coating information by associating a proper amount of the resin 8 for obtaining the LED package 50 having the specified emission characteristic with the element characteristic information.

Specifically, the element characteristic information providing device that provides the component mounting device M1 with the element characteristic information 12 and the resin information providing device that provides the resin coating device M4 with the resin coating information 14 transmit the element characteristic information and the resin coating information, which have been read from the storage unit 61 of the management computer 3 acting as an external storage, respectively to the component mounting device M1 and the resin coating device M4 through the LAN system 2.

Figure 12:
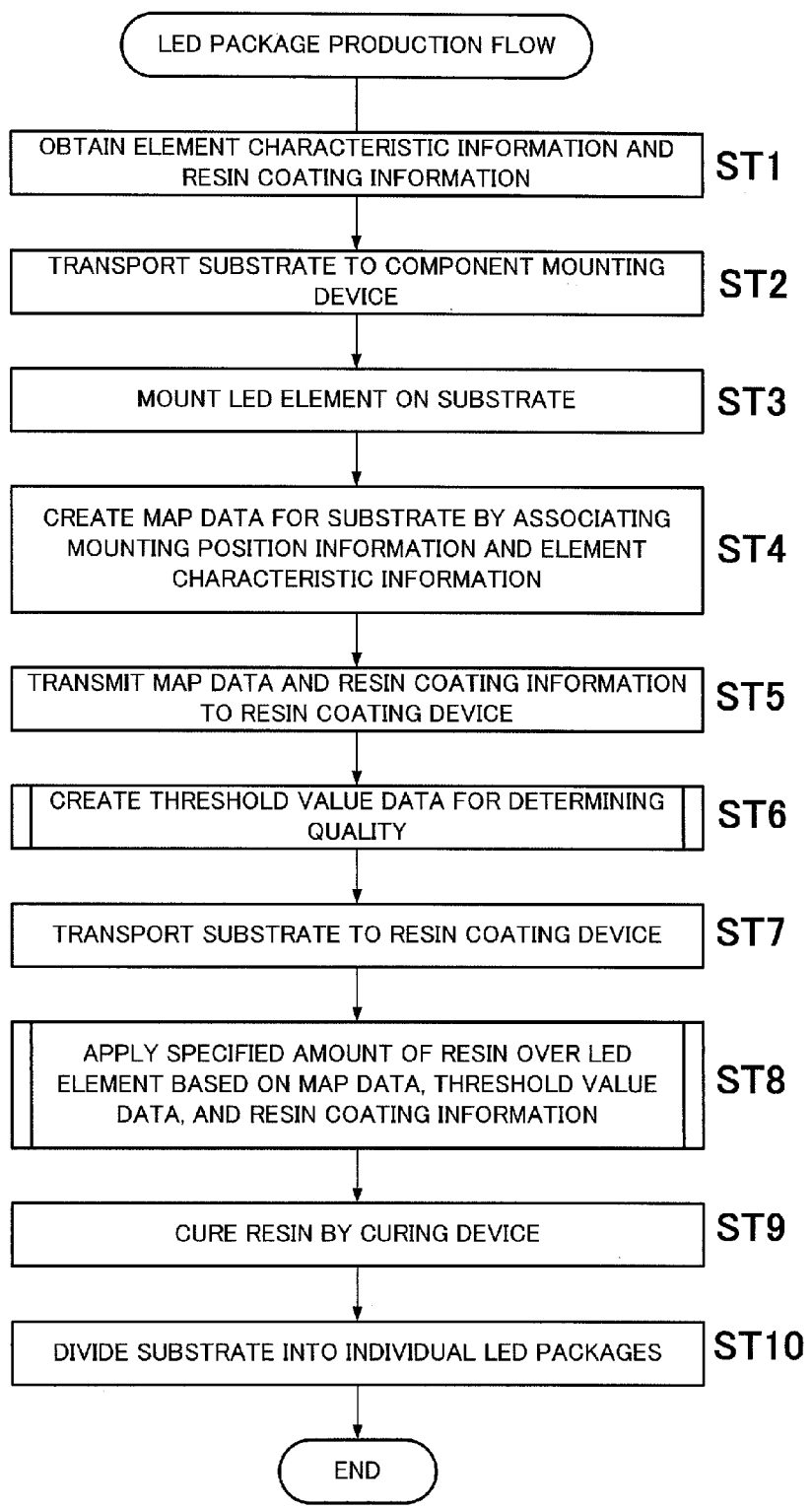
FIG. 12 is a flowchart showing LED package production by the LED package production system according the embodiment of the present invention.

Referring to the flowchart of FIG. 12, the LED package production process performed by the LED package production system 1 will be described below in accordance with the accompanying drawings. First, the element characteristic information 12 and the resin coating information 14 are obtained (ST1). Specifically, the element characteristic information 12 and the resin coating information 14 are acquired from an external device through the LAN system 2 or a storage medium. The element characteristic information 12 is obtained by separately measuring emission characteristics including the emission wavelengths of the LED elements 5 beforehand, and the resin coating information 14 is obtained by associating a proper amount of the resin 8 for obtaining the LED package 50 having the specified emission characteristic with the element characteristic information 12.

Figure 18:
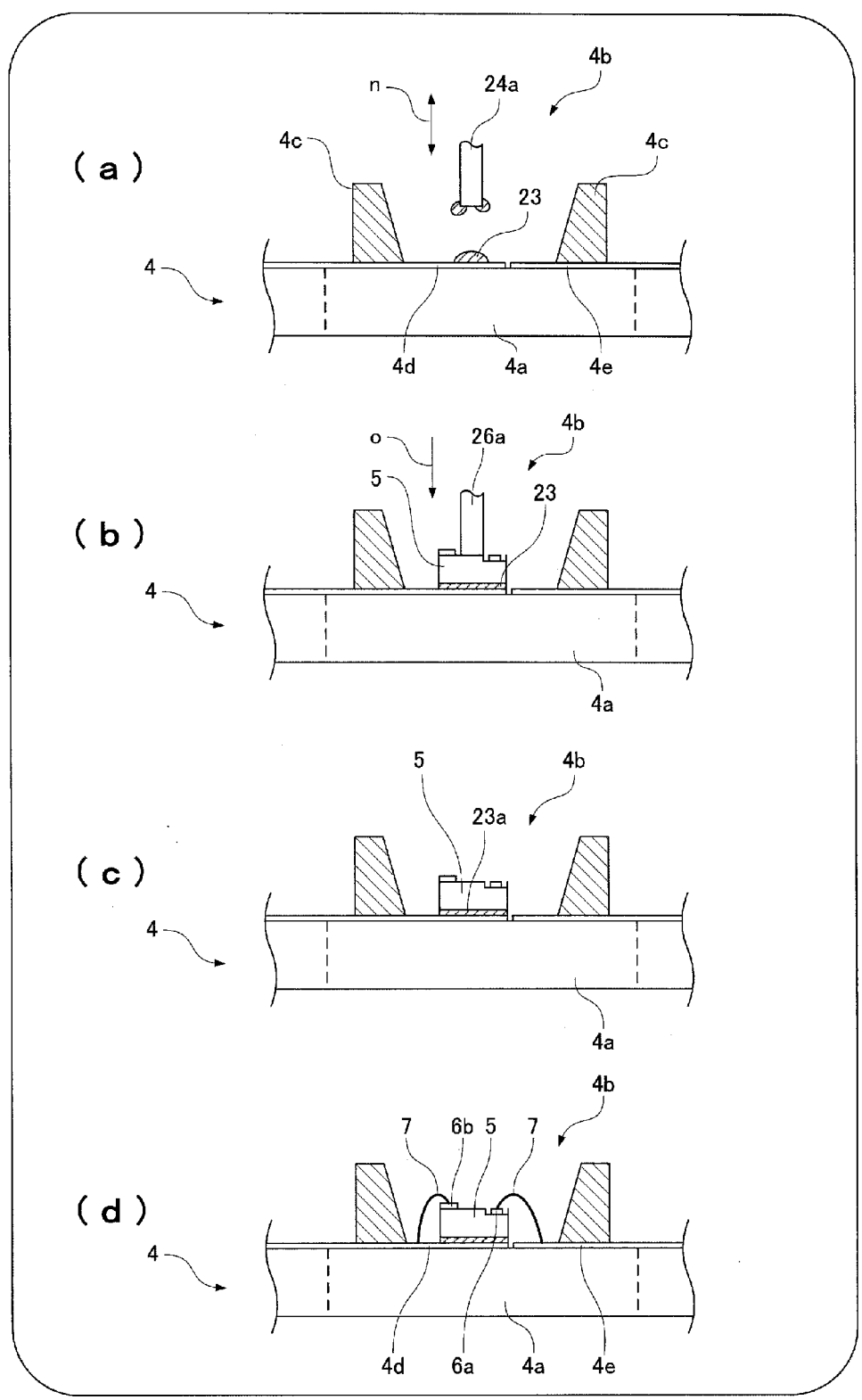
FIG. 18 is a process explanatory drawing illustrating the process of LED package production of the LED package production system according to the embodiment of the present invention.

After that, the substrate 4 for mounting is transported into the component mounting device M1 (ST2). As shown in FIG. 18(*a*), the transfer pin 24*a* of the adhesive transfer mechanism 24 is moved up and down (arrow n) to supply the resin adhesive 23 to an element mounting position in the LED mounting part 4*b*. After that, as shown in FIG. 18(*b*), the LED element 5 held on the mounting nozzle 26*a* of the component mounting mechanism 26 is moved down (arrow o) and is mounted in the LED mounting part 4*b* of the substrate 4 with the resin adhesive 23 (ST3). Based on data on the component mounting operation, the mapping unit 74 creates the map data 18 for the substrate 4 by associating the mounting position information 71*a* and the element characteristic information 12 on each of the LED elements 5 (ST4). The map data 18 is then transmitted from the component mounting device M1 to the resin coating device M4, and the resin coating information 14 is transmitted from the management computer 3 to the resin coating device M4 (ST5). This allows the resin coating device M4 to perform a resin coating operation.

The substrate 4 with the mounted component is then transported to the curing device M2 and is heated therein, so that as illustrated in FIG. 18(*c*), the resin adhesive 23 is cured by heat into resin adhesive 23*a* and the LED element 5 is fixed on the single-piece substrate 4*a*. The substrate 4 with the cured resin is then transported to the wire bonding device M3. As illustrated in FIG. 18(*d*), the wiring layers 4*e* and 4*d* of the single-piece substrate 4*a* are connected respectively to the N-type electrode 6*a* and the P-type electrode 6*b* of the LED element 5 via the bonding wires 7.

Next, the threshold value data for determining quality is created (ST6). The data is created for setting a threshold value for determining quality during coating application for production (see the threshold value data 81*a* in FIG. 11). This processing is repeated for the respective Bin codes [1], [2], [3], [4], and [5] in the coating application for production. Referring to FIGS. 13, 14A to 14C, and 15, the creation of the threshold value data will be described in detail.

Figure 13:
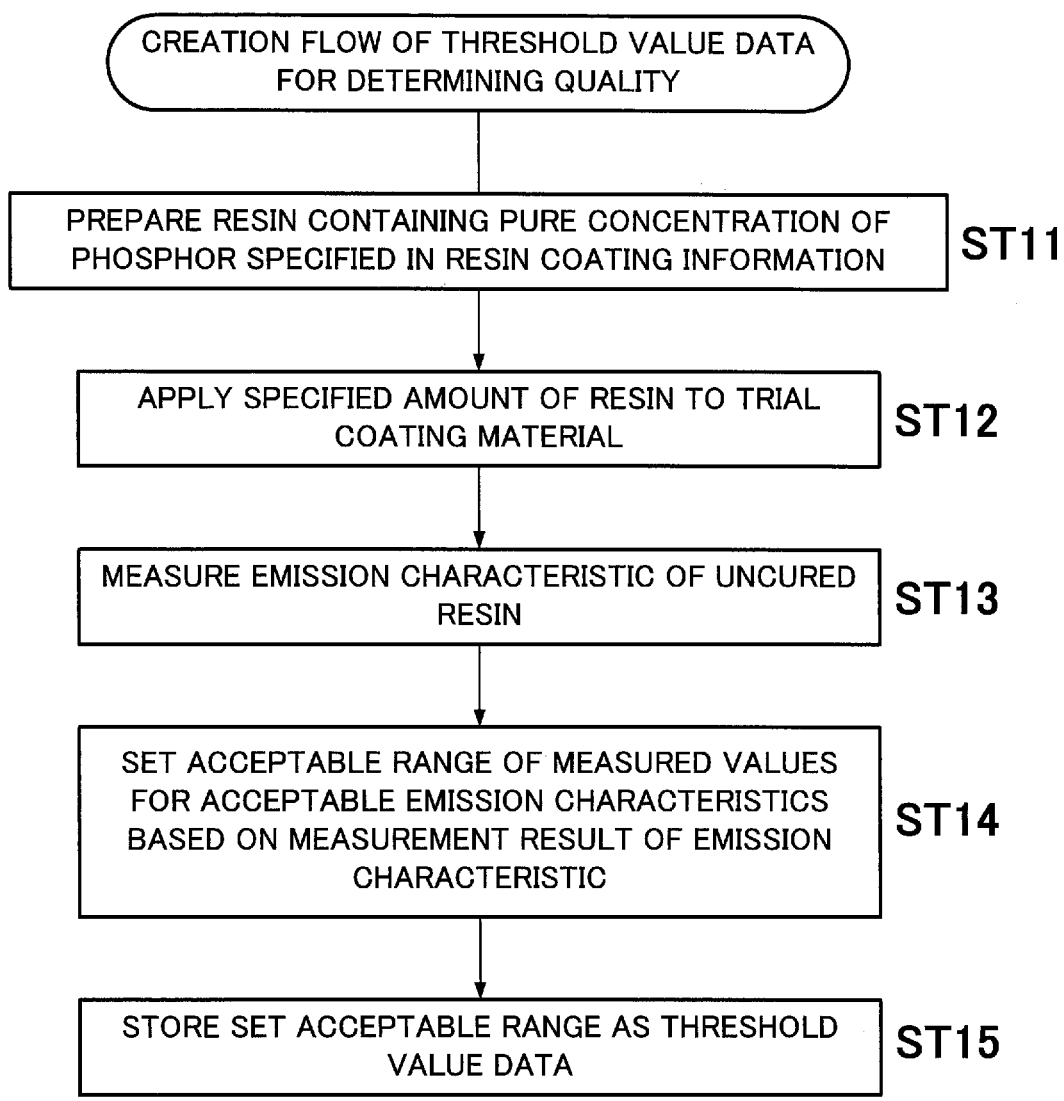
FIG. 13 is a flowchart showing creation of threshold value data for determining quality in the LED package production system according to the embodiment of the present invention.
Figure 15:
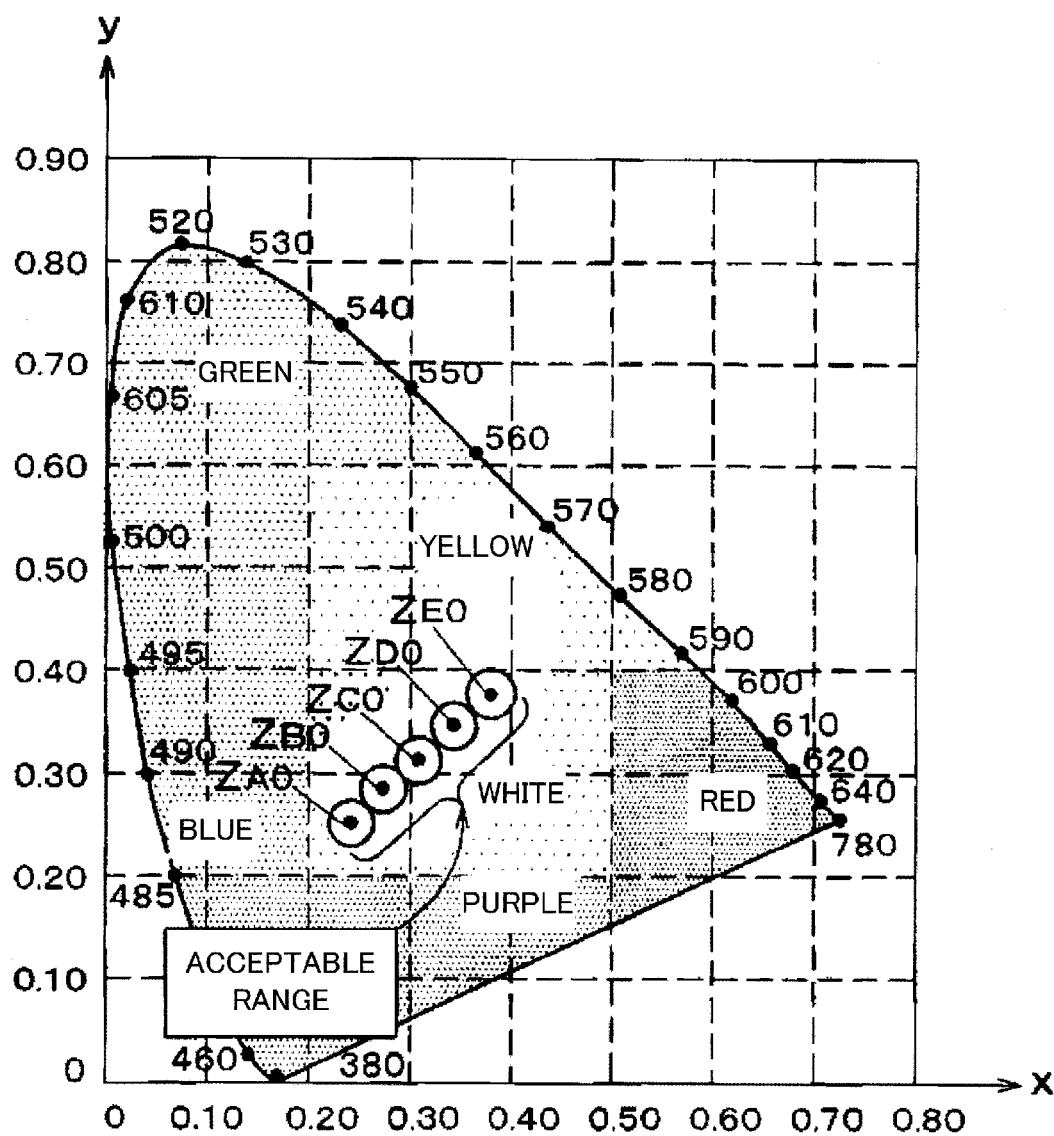
FIG. 15 is a chromaticity diagram for explaining the threshold value data for determining quality in the LED package production system according to the embodiment of the present invention.

In FIG. 13, first, the resin 8 containing a pure concentration of phosphor specified in the resin coating information 14 is prepared (ST11). The resin 8 is set in the resin dispenser head 32, and then the resin dispenser head 32 is moved to the trial coating stage 40*a* of the trial coating/measuring unit 40 to apply the resin 8 to the trial coating material 43 according to the specified amount of coating (proper amount of resin coating) in the resin coating information 14 (ST12). The resin 8 applied to the trial coating material 43 is then moved onto the trial coating material loading part 41, and the LED element 5 is caused to emit light to measure the emission characteristic of the resin 8 in an uncured state by means of the emission characteristic unit having the foregoing configuration (ST13). Based on an emission characteristic measured value 39*a*, which is a measurement result of the emission characteristic measured by the emission characteristic measuring unit, the acceptable range of measured values is set for acceptable emission characteristics (ST14). The set acceptable range is stored as the threshold value data 81*a* in the storage unit 81, and then the acceptable range is transferred to the management computer 3 and is stored in the storage unit 61 (ST15).

FIGS. 14A to 14C show the threshold value data created in the foregoing manner, that is, the emission characteristic measured values determined in an uncured state of the resin and the acceptable ranges (threshold values) of measured values for acceptable emission characteristics after the resin 8 with a pure content of phosphor is applied. FIGS. 14A to 14C show threshold values for the respective Bin codes [1], [2], [3], [4], and [5] when the resin 8 has phosphor concentrations of 5%, 10%, and 15%.

For example, as shown in FIG. 14A, when the resin 8 has a phosphor concentration of 5%, the Bin codes 12*b* have amounts of coating indicated in proper resin coating amount 15(1). Emission characteristic measured values 39*a*(1) indicate the measurement results of the emission characteristics of light that is emitted from the amounts of the resin 8 by irradiation of blue light from the LED element 5, the emission characteristics being measured by the emission characteristic measuring unit. Threshold value data 81*a*(1) is set based on the emission characteristic measured values 39*a*(1). For example, when the emission characteristic of the resin 8 having a proper resin coating amount VA0 for the Bin code [1] is measured, the measurement result is represented as a chromaticity coordinate ZA0 (XA0, YA0) on a chromaticity diagram in FIG. 15. With respect to the chromaticity coordinate ZA0, a predetermined range (e.g., ±10%) of X coordinates and Y coordinates on the chromaticity diagram is set as an acceptable range (threshold value). Also for the proper resin coating amounts for the other Bin codes [2] to [5], acceptable ranges (threshold values) are set based on emission characteristic measurement results (see chromaticity coordinates ZB0 to ZE0 on the chromaticity diagram in FIG. 15). The predetermined range as the threshold value is optionally set according to the accuracy level of emission characteristics required for the product LED package 50.

FIGS. 14B and 14C show emission characteristic measured values and acceptable ranges (threshold values) when the resin 8 has phosphor concentrations of 10% and 15%. In FIGS. 14B and 14C, proper resin coating amount 15(2) and proper resin coating amount 15(3) indicate proper resin coating amounts for phosphor concentrations of 10% and 15%, respectively. Emission characteristic measured value 39a(2) and emission characteristic measured value 39a(3) indicate emission characteristic measured values for phosphor concentrations of 10% and 15%, respectively. Threshold value data 81a(2) and threshold value data 81a(3) indicate acceptable ranges (threshold values) for the respective phosphor concentrations. The threshold value data created in this manner is used depending on the Bin code 12b of the target LED element 5 in the coating application for production. The creation of the threshold value data may be performed as an off-line operation in (ST6) by a single testing unit separately provided from the LED package production system 1, and data stored beforehand as the threshold value data 81a in the management computer 3 may be transmitted to the resin coating device M4 through the LAN system 2.

Figure 19:
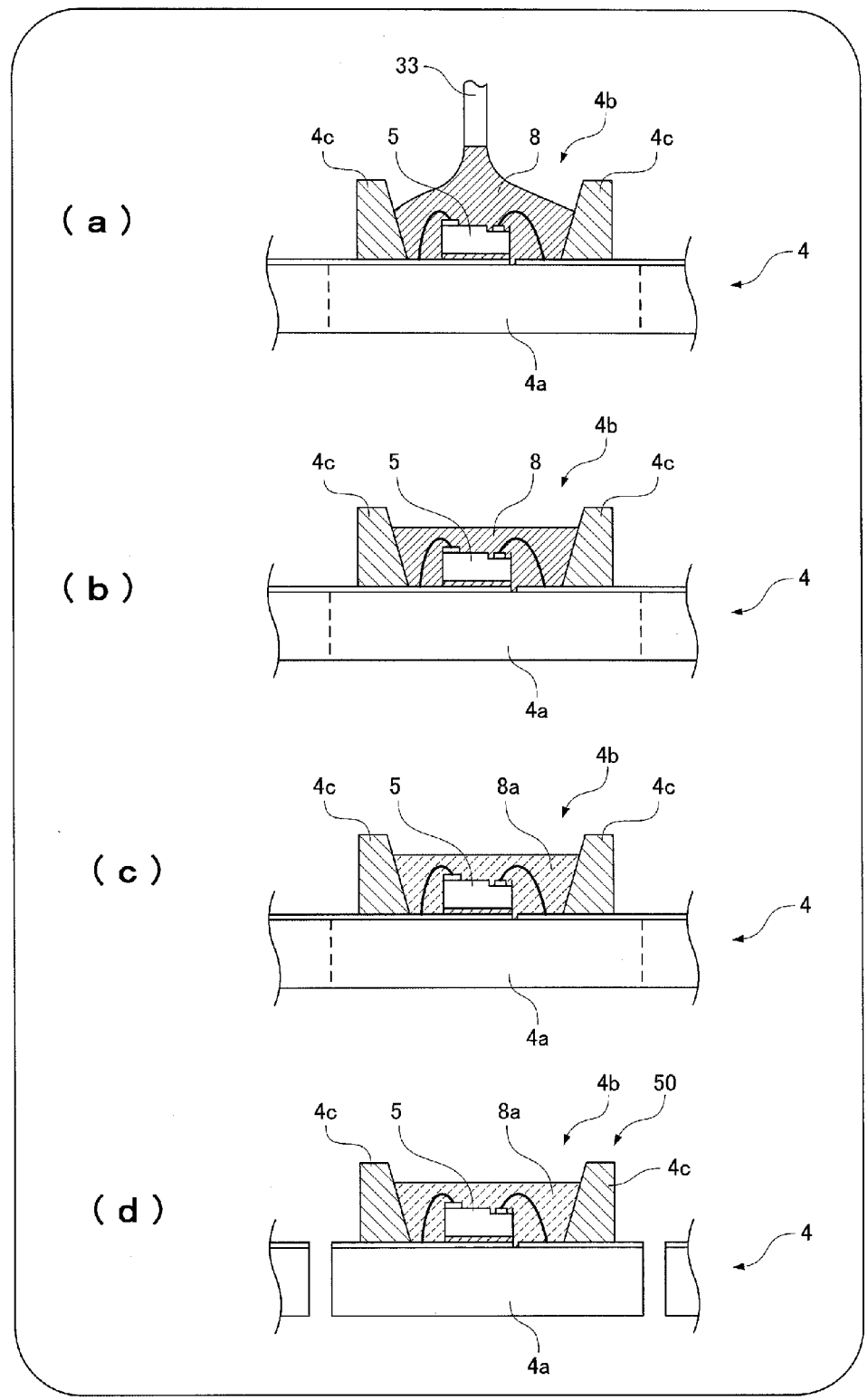
FIG. 19 is a process explanatory drawing illustrating the process of LED package production of the LED package production system according to the embodiment of the present invention.

The wire-bonded substrate 4 is then transported to the resin coating device M4 (ST7). As shown in FIG. 19(a), the resin 8 is dispensed from the dispenser nozzle 33a into the LED mounting part 4b surrounded by the reflective part 4c. In this case, based on the map data 18, the threshold value data 81a, and the resin coating information 14, the specified amount of the resin 8 in FIG. 19(b) is applied over the LED element 5 (ST8). Referring to FIGS. 14A to 14C and FIG. 15, the resin coating application will be described in detail. First, at the start of the resin coating application, a resin container is replaced with another as required (ST21). Specifically, the dispenser 33 attached to the resin dispenser head 32 is replaced with another dispenser that stores the resin 8 having a phosphor concentration selected depending on the characteristic of the LED element 5.

Next, the resin coating part C applies a trial coating of the resin 8 for emission characteristic measurement to the translucent trial coating material 43 (measurement coating step) (ST22). Specifically, the trial coating material 43 drawn to the trial coating stage 40a in the trial coating/measuring unit 40 is coated with the proper resin coating amounts of the resin 8 (VA0 to VE0) for the respective Bin codes 12b specified in FIG. 4. At this point, even if the resin dispenser mechanism 35 is notified of dispensing parameters for the respective proper resin coating amounts (VA0 to VE0), an actual amount of resin dispensed from the dispenser nozzle 33a and applied to the trial coating material 43 is not always equal to the proper amount of resin coating because of a change of the property of the resin 8 with the passage of time. As shown in FIG. 17A, actual amounts VA1 to VE1 of resin coating are slightly different from VA0 to VE0.

The trial coating material 43 is transported into the trial coating/measuring unit 40, so that the trial coating material 43 coated with the trial coating of the resin 8 is transported to the trial coating material loading part 41 (trial coating material loading step). Then, excitation light for exciting phosphor is emitted from the light source 45 disposed above the trial coating material loading part 41 (excitation light emitting step). The excitation light strikes from above the resin 8 applied to the trial coating material 43, allowing the resin 8 to emit light from the underside of the trial coating material 43 to the spectroscope 42 through the integrating sphere 44. The emission characteristic measuring unit 39 measures the emission characteristic of the light (emission characteristic measuring step) (ST23).

Thus, as shown in FIG. 17B, emission characteristic measured values represented as chromaticity coordinates Z (see FIG. 15) are obtained. The measurement results are not always identical to the specified emission characteristic, that is, standard chromaticity coordinates ZA0 to ZE0 in proper resin coating shown in FIG. 14A because of errors in the amounts of coating and variations in the concentrations of phosphor particles in the resin 8. Hence, deviations (ΔXA, ΔYA) to (ΔXE, ΔYE) at X, Y coordinates are determined which indicate differences between the obtained chromaticity coordinates ZA1 to ZE1 and the standard chromaticity coordinates ZA0 to ZE0 in proper resin coating shown in FIG. 14A. This enables a decision on whether a correction is necessary for obtaining a desired emission characteristic.

In this case, it is decided whether measurement results are within the threshold values or not (ST24). As shown in FIG. 17C, the deviations determined in (ST23) and the threshold values are compared to each other to decide whether or not the deviations (ΔXA, ΔYA) to (ΔXE, ΔYE) are within the range of ±10% relative to ZA0 to ZE0. In the case where the deviations are within the threshold values, the dispensing parameters for the set proper resin coating amounts VA0 to VE0 are kept to apply a coating for production. In the case where the deviations exceed the threshold values, the amounts of coating are corrected (ST25). Specifically, deviations of measurement results in the emission characteristic measuring step from the specified emission characteristic are determined, and corrections for the determined deviations are added to the proper resin coating amounts VA0 to VE0, respectively. As shown in FIG. 17D, other proper resin coating amounts VA2 to VE2 to be applied for actual production to the LED elements 5 are derived by the coating amount deriving unit 38 (coating amount deriving step).

In this case, the corrected proper resin coating amounts (VA2 to VE2) are updated values that are determined by adding the corrections for the respective deviations to the set proper resin coating amounts VA0 to VE0. The relationship between the deviations and the corrections is recorded as known associated data beforehand in the resin coating information 14. Then, based on the corrected proper resin coating amounts (VA2 to VE2), processing of (ST22), (ST23), (ST24), and (ST25) is repeated. When it is confirmed that deviations of the measurement results from the specified emission characteristics are within the threshold values in (ST24), proper resin coating amounts for actual production are determined. In other words, in the resin coating method, the measurement coating step, the trial coating material loading step, the excitation light emitting step, the emission characteristic measuring step, and the coating amount deriving step are repeatedly performed, thereby definitely deriving proper resin coating amounts. The determined proper resin coating amounts are stored in the storage unit 81 as the actual production coating amounts 81b.

Figure 16:
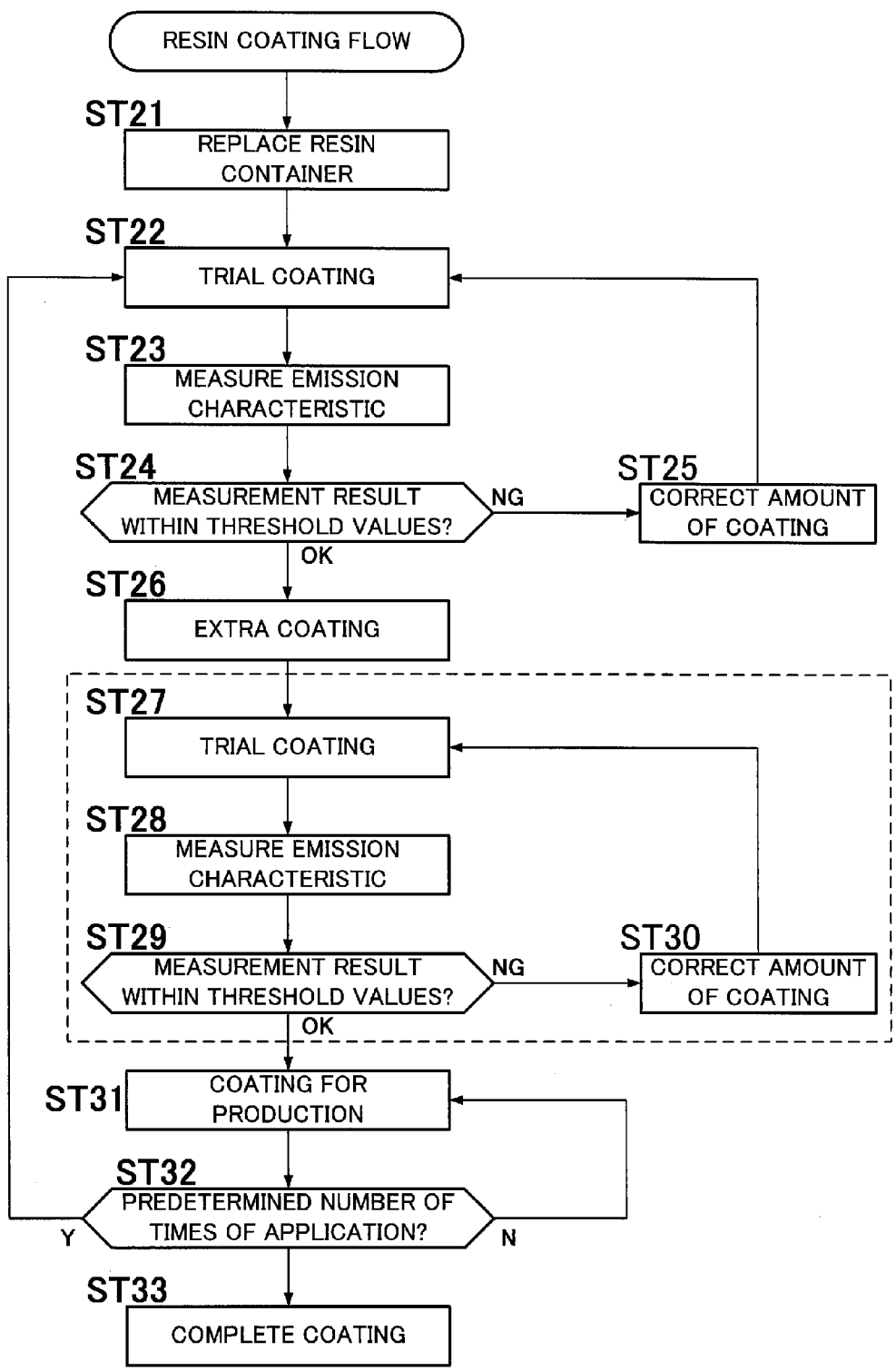
FIG. 16 is a flowchart showing resin coating application in a process of LED package production of the LED package production system according to the embodiment of the present invention.

After that, the process advances to the subsequent step to apply an extra coating (ST26). In this case, a predetermined amount of the resin 8 is dispensed from the dispenser nozzle 33a so as to improve a resin flow in a resin path and stabilize the operations of the dispenser 33 and the resin dispenser mechanism 35. Processing in (ST27), (ST28), (ST29), and (ST30) indicated by a broken line in FIG. 16 is similar to that of (ST22), (ST23), (ST24), and (ST25) and is not always necessary. This processing is performed when it is necessary to carefully confirm that a desired emission characteristic is completely obtained.

When the proper resin coating amounts for providing the desired emission characteristic are determined, a coating is applied for production (ST31). Specifically, a proper resin coating amount derived by the coating amount deriving unit 38 and stored as the actual production coating amount 81b is notified by the production unit 37 to the coating control unit 36 for controlling the resin dispenser mechanism 35. Thus, the proper resin coating amount of the resin 8 is applied for production to the LED element 5 mounted on the substrate 4 (production step).

In the process of repeating the coating application for production, the number of times of coating application by the dispenser 33 is counted, and it is confirmed whether or not the number of times of coating application has exceeded a predetermined number of times (ST32). In other words, before the number of times of coating application reaches the predetermined number of times, it is decided that the property of the resin 8 and the concentration of phosphor have hardly changed. Thus, the coating application for production (ST31) is repeated while keeping the same actual production coating amount 81b. When the predetermined number of times is confirmed in (ST32), it is decided that the property of the resin 8 and the concentration of phosphor may have changed. Thus, the process returns to (ST22) to repeatedly measure emission characteristics in a similar manner and correct amounts of coating based on the measurement results.

At the completion of resin coating on the substrate 4, the substrate 4 is transported to the curing device M5 and is heated by the curing device M5 so as to cure the resin 8 (ST9). Thus, as illustrated in FIG. 19(c), the resin 8 covering the LED element 5 is cured by heat into resin 8a fixed in the LED mounting part 4b. Next, the substrate 4 with the cured resin is transported to the piece cutting device M6 and is cut into the single-piece substrates 4a, forming the individual LED packages 50 as illustrated in FIG. 19(d) (ST10). Thus, the LED packages 50 are completed.

As has been discussed, the LED package production system 1 according to the embodiment includes the component mounting device M1 that mounts the LED elements 5 on the substrate 4, the element characteristic information providing device that provides, as the element characteristic information 12, information obtained by separately measuring the emission wavelengths of the LED elements 5 beforehand, a resin information providing device that provides, as the resin coating information 14, information obtained by associating a proper amount of the resin 8 for obtaining the LED package 50 having the specified emission characteristic with the element characteristic information 12, the map data creating unit that creates the map data 18 for each of the substrates 4 by associating the mounting position information 71a, which indicates the position of the LED element 5 mounted on the substrate 4 by the component mounting device M1, with the element characteristic information 12 on the LED element 5, and the resin coating device M4 that applies the proper amount of the resin 8 for obtaining the specified emission characteristic, based on the map data 18 and the resin coating information 14, to each of the LED elements mounted on the substrate 4.

The resin coating device M4 includes the resin coating part C that applies varying amounts of the resin 8 to any target position, the coating control unit 36 that controls the resin coating part C to apply a coating for measurement such that a trial coating of the resin 8 for emission characteristic measurement is applied to the trial coating material 43, and apply a coating for production such that the resin 8 for actual production is applied to the LED element 5, the trial coating material loading part 41 that includes a light source for emitting excitation light for exciting phosphor, the trial coating material loading part 41 being loaded with the trial coating material 43 on which the trial coating of the resin 8 has been applied in the coating application for measurement, the emission characteristic measuring unit that measures the emission characteristic of light emitted from the resin 8, the light being emitted by irradiating the resin 8 applied to the trial coating material 43 with excitation light emitted from the light source, the coating amount deriving unit 38 that determines deviations of the measurement results of the emission characteristic measuring unit from the specified emission characteristic and corrects proper resin coating amounts based on the deviations, thereby deriving proper amounts of resin coating to be applied for actual production to the LED elements 5, and the production unit 37 that notifies the coating control unit 36 of the derived proper resin coating amounts to apply the proper amount of the resin to the LED element 5 as the coating application for production.

With this configuration, in the resin coating used for the production of the LED package 50 including the LED element 5 covered with resin containing phosphor, the trial coating material loading part 41 is loaded with the trial coating material 43 on which a trial coating of the resin 8 is applied for measuring an emission characteristic, excitation light for exciting phosphor is emitted from the light source 45 disposed above the trial coating material 43, and deviations are determined between the specified emission characteristic and the measurement results of emission characteristics of light that is emitted from the resin 8 and is received from the underside of the trial coating material 43, the light being emitted by irradiating the resin 8 on the trial coating material 43 with the excitation light from above. Proper amounts of resin to be applied for actual production to the LED elements 5 can be derived based on the deviations. Thus, even if the LED elements 5 are varied in emission wavelength, the LED packages 50 can have uniform emission characteristics with a higher production yield.

Moreover, in the LED package production system 1 configured thus, the management computer 3 and the devices ranging from the component mounting device M1 to the piece cutting device M6 are connected to one another via the LAN system 2. The LAN system 2 is not necessarily an essential constituent element. The functions of the LED package production system 1 according to the present embodiment can be achieved as long as a storage device is provided to store the element characteristic information 12 and the resin coating information 14, which are prepared beforehand and are transmitted from the outside, for each of the LED packages 50 and a data providing device is provided to optionally provide the element characteristic information 12 for the component mounting device M1 and the resin coating information 14 and the map data 18 for the resin coating device M4 from the storage device.

Figure 20A:
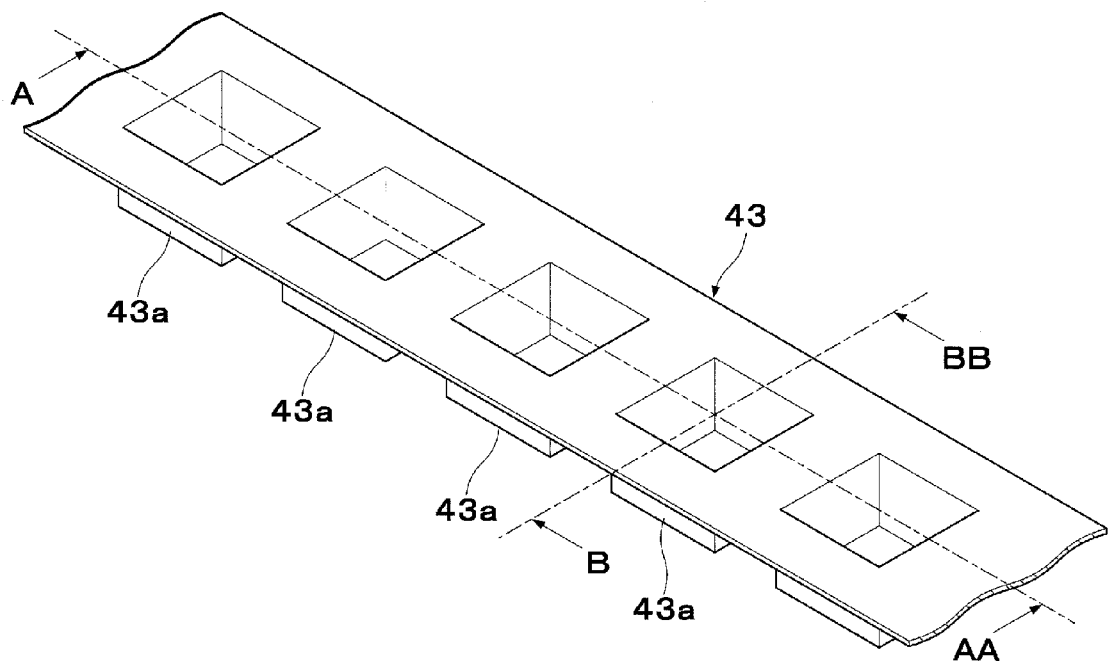
FIG. 20A is a perspective view illustrating the trial coating material of the resin coating device according to the embodiment of the present invention.
Figure 20B:
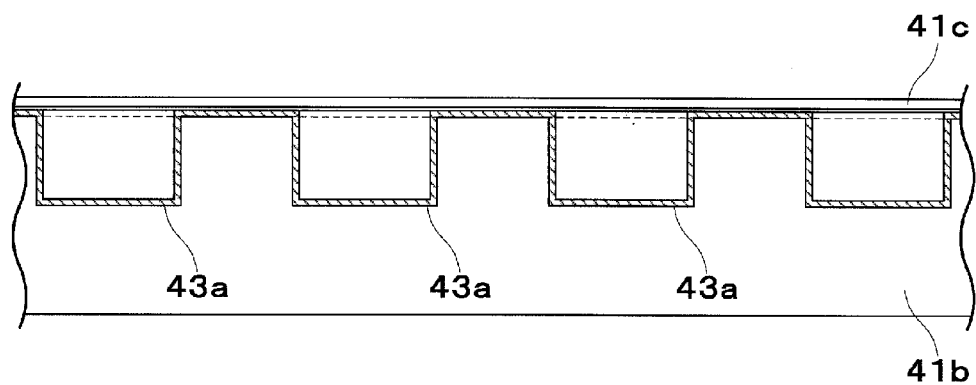
FIG. 20B is a cross-sectional view taken along the line A-AA of FIG. 20A.
Figure 20C:
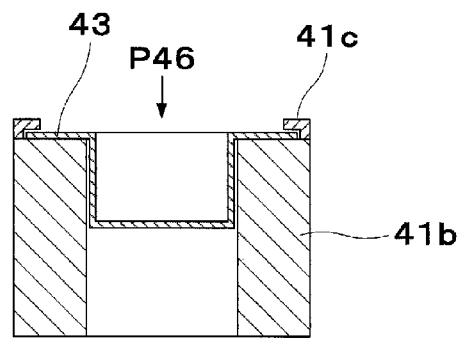
FIG. 20C is a cross-sectional view taken along the line B-BB of FIG. 20A.

FIG. 20A is a perspective view illustrating the trial coating material 43 including the embossed portions 43a illustrated in (b2) of FIG. 8B. FIGS. 20B and 20C are A-AA and B-BB sectional views illustrating the trial coating material 43 of FIG. 20A, the trial coating material 43 being set on the trial coating material loading part 41. An arrow P46 indicates the position of the irradiation part 46.

Figure 21A:
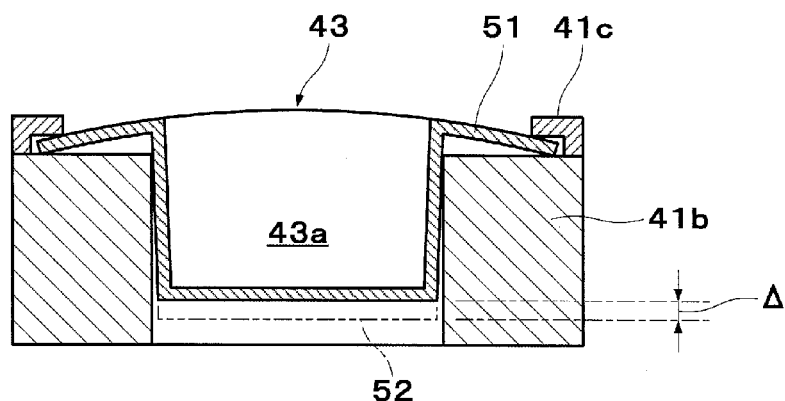
FIG. 21A is a cross-sectional view illustrating the trial coating material protruded by curling.
Figure 21B:
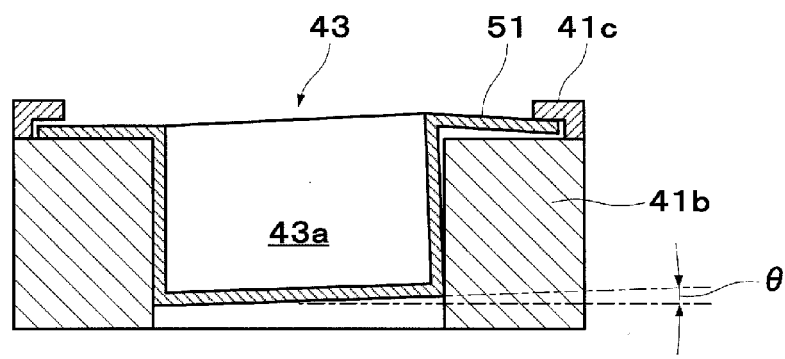
FIG. 21B is a cross-sectional view illustrating the trial coating material inclined by curling.
Figure 21C:
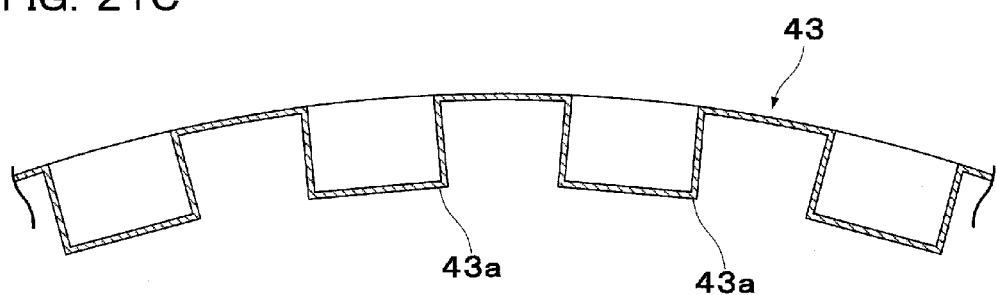
FIG. 21C is a cross-sectional view illustrating longitudinal curling of the trial coating material.

The stored trial coating material 43 is wound around the supply reel 47 and thus the trial coating material 43 drawn from the supply reel 47 is curled as illustrated in FIGS. 21A, 21B, and 21C.

FIGS. 21A and 21B show specific examples of the trial coating material 43 curled in the width direction.

In FIG. 21A, a top piece 51 of the trial coating material 43 is deformed such that the position of the bottom of the trial coating material 43 moves upward from a specified position 52 by A.

In FIG. 21B, the top piece 51 of the trial coating material 43 is deformed, causing an error such that the bottom of the trial coating material 43 is inclined by an angle θ.

FIG. 21C illustrates the trial coating material 43 that is curled in the longitudinal direction because the trial coating material 43 has been wound around the supply reel 47. Also in this case, the trial coating material 43 is wound around the take-up reel 48 while being guided by the upper guide member 41c and the lower support member 41b, causing a protrusion and an inclination shown in FIGS. 21A and 21B.

In the case where the position of the trial coating material 43 becomes unstable in the irradiation part 46 due to a protrusion and an inclination, detectivity for the wavelength of light incident on the integrating sphere 44 also becomes unstable, leading to lower precision of chromaticity correction.

In the present embodiment, as illustrated in FIGS. 22(a), 22(b), 23, and 24, a clamp unit 63 is provided that draws the trial coating material 43 in the irradiation part 46 (during a measurement of the emission characteristic measuring unit 39) to the trial coating material loading part 41 to locate the trial coating material 43.

Figure 22:
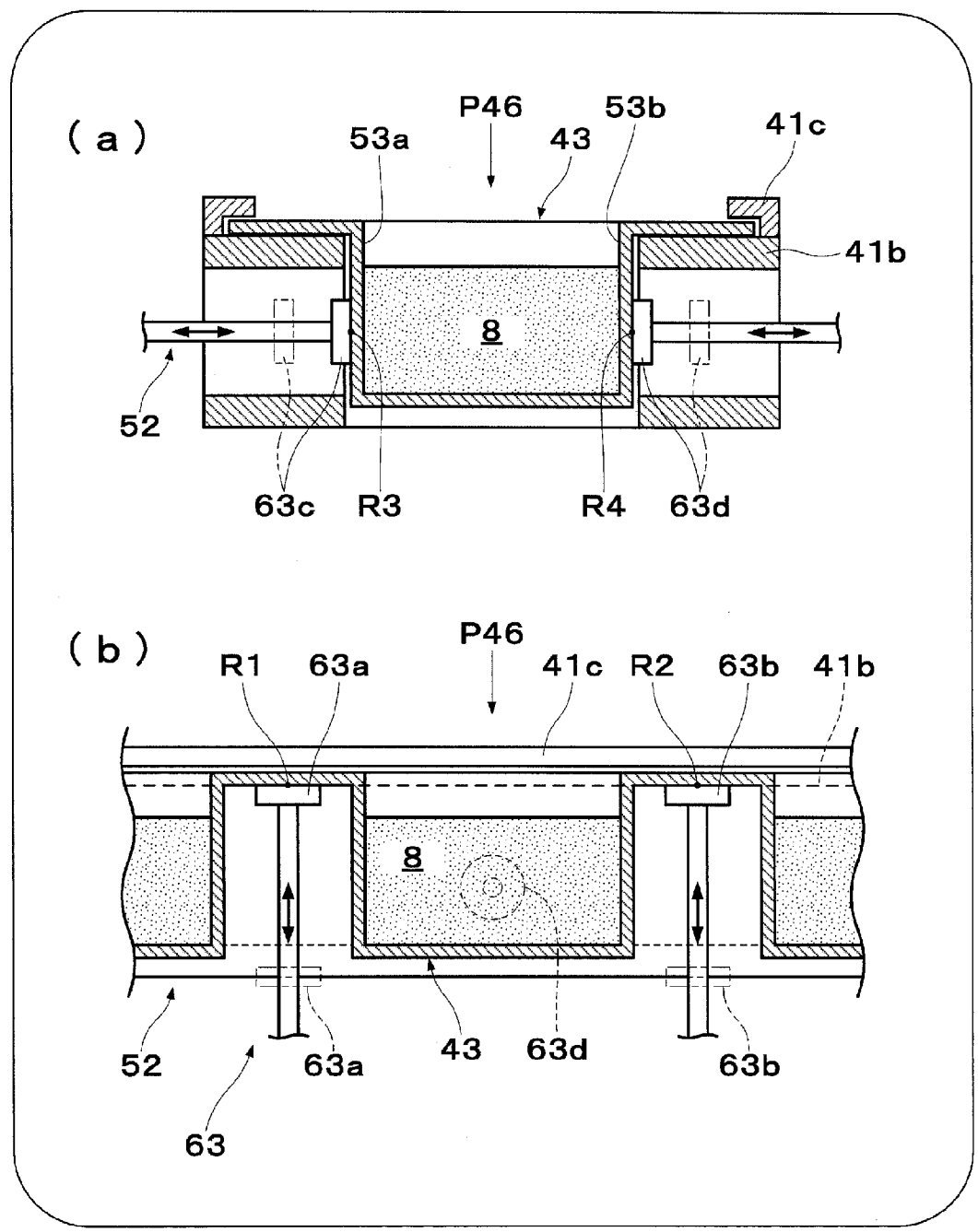
FIG. 22 illustrates a longitudinal section of a trial coating material 43 and a trial coating material loading part 41 at a position of an irradiation part 46 of the resin coating device and illustrates a cross-sectional view of the trial coating material 43 along a transfer direction according to the embodiment of the present invention.
Figure 23:
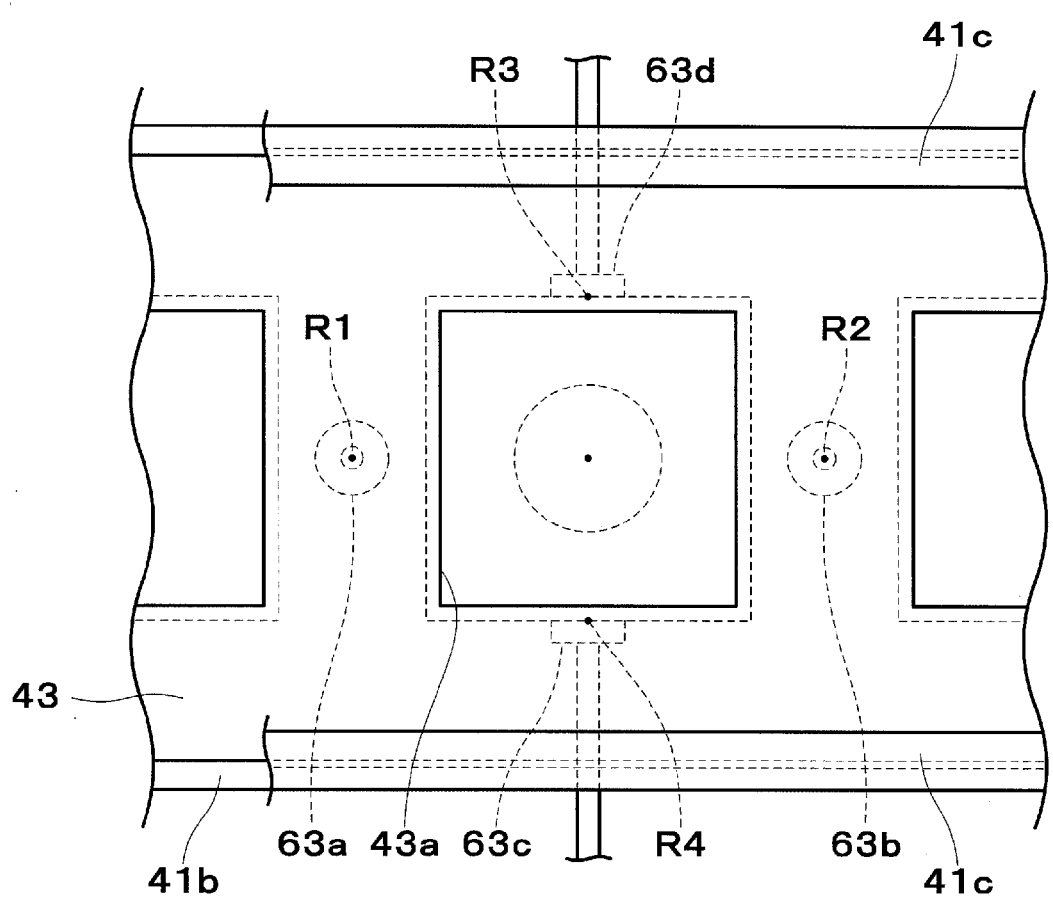
FIG. 23 is a plan view of FIG. 22.

FIG. 22(a) illustrates a longitudinal section of the trial coating material 43 and the trial coating material loading part 41 in the irradiation part 46. FIG. 22(b) is a cross-sectional view along the transfer direction of the trial coating material 43 in and around the irradiation part 46. FIG. 23 is a plan view of FIGS. 22(a) and 22(b).

The clamp unit 63 includes first to fourth suction nozzles 63a to 63d.

The first and second suction nozzles 63a and 63b are provided between the embossed portions 43a that are formed next to the trial coating material 43. As illustrated in FIG. 22(b), the first and second suction nozzles 63a and 63b each extend and contract between a virtual line position and a solid line position. As illustrated in FIG. 22(a), the third and fourth suction nozzles 63c and 63d respectively extend and contract to and from opposed sides 53a and 53b on the outer surface of the embossed portion 43a, the suction nozzles each extending and contracting between a solid line position and a virtual line position. The proximal ends of the first to fourth suction nozzles 63a to 63d are connected to a vacuum source (not shown) via control valves.

When the embossed portions 43a of the trial coating material 43 with the trial coating of the resin 8 for measurement reach the position P46 of the irradiation part 46, the first and second suction nozzles 63a and 63b are first driven from the vertical line positions to the solid line positions to suck points R1 and R2 between the adjacent embossed portions, allowing the trial coating material 43 to be pressed and fixed to the top surface of the lower support member 41b.

The third and fourth suction nozzles 63c and 63d are then driven from the virtual line positions to the solid line positions to suck and fix points R3 and R4 on the sides 53a and 53b of the embossed portion.

At the completion of measurement of the trial coating of the resin 8, the vacuum suction of the trial coating material 43 by the first to fourth suction nozzles 63a to 63d is completed to move the first to fourth suction nozzles 63a to 63d back to the virtual line positions. The transparent member 43 is then wound up by the take-up reel 48 until the subsequent embossed portion 43a reaches the irradiation part 46.

Figure 24:
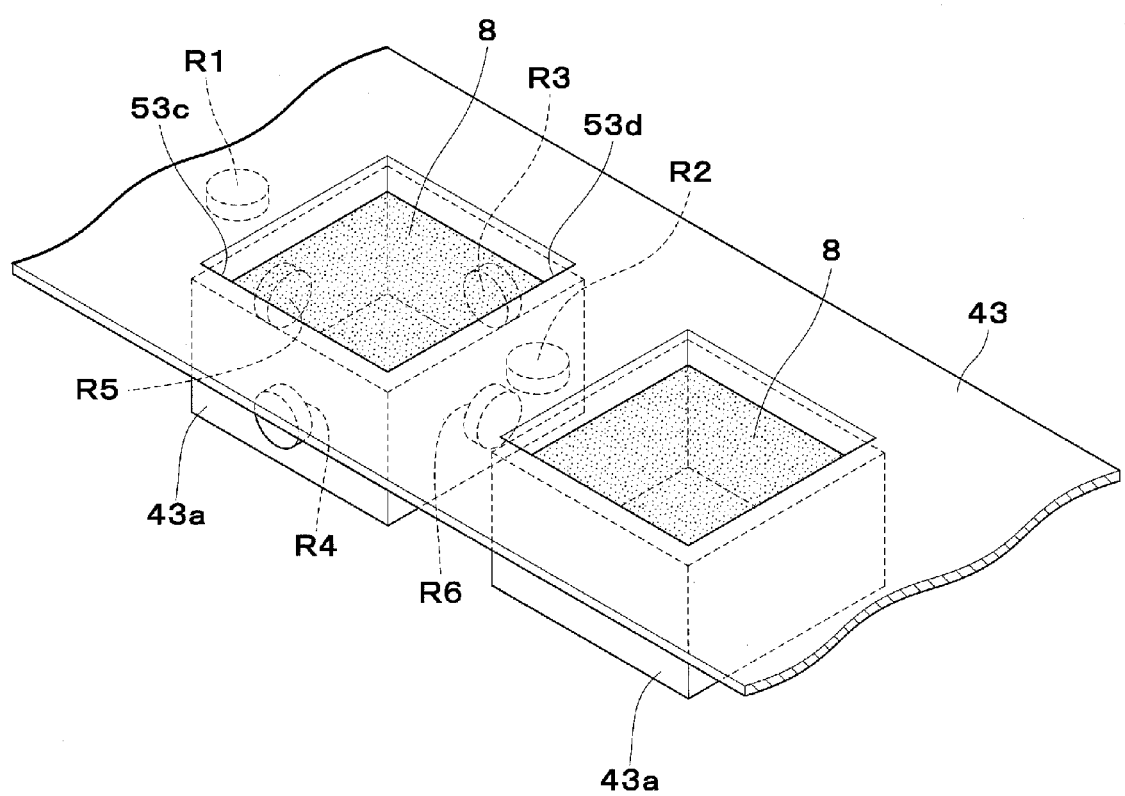
FIG. 24 is a perspective view of the trial coating material in another specific example of the resin coating device according to the embodiment of the present invention.

In this configuration, the points R1 to R4 of the trial coating material 43 are sucked and held by the first to fourth suction nozzles 63a to 63d. As illustrated in FIG. 24, points R5 and R6 on outer sides 53c and 53d of the embossed portion 43a may be simultaneously sucked and held by suction nozzles while the points R1 to R4 are sucked and held by the first to fourth suction nozzles 63a to 63d.

In the examples of FIGS. 22(a), 22(b), 23, and 24, the trial coating material 43 has the embossed portions 43a. In the case of the tape trial coating material 43 having no embossed portions as illustrated in FIG. 8B(b1), the first and second suction nozzles 63a and 63b suck the trial coating material 43 from the back side of the trial coating material 43, thereby avoiding the influence of curling.

Second Embodiment

In the foregoing embodiment, in the case of the tape trial coating material 43, the resin 8 at the irradiation part 46 is placed on the top surface of the flat trial coating material 43. Configurations in FIGS. 25 and 26 can also stabilize the shape of resin 8 and avoid the influence of curling for a tape trial coating material 43.

Figure 25:
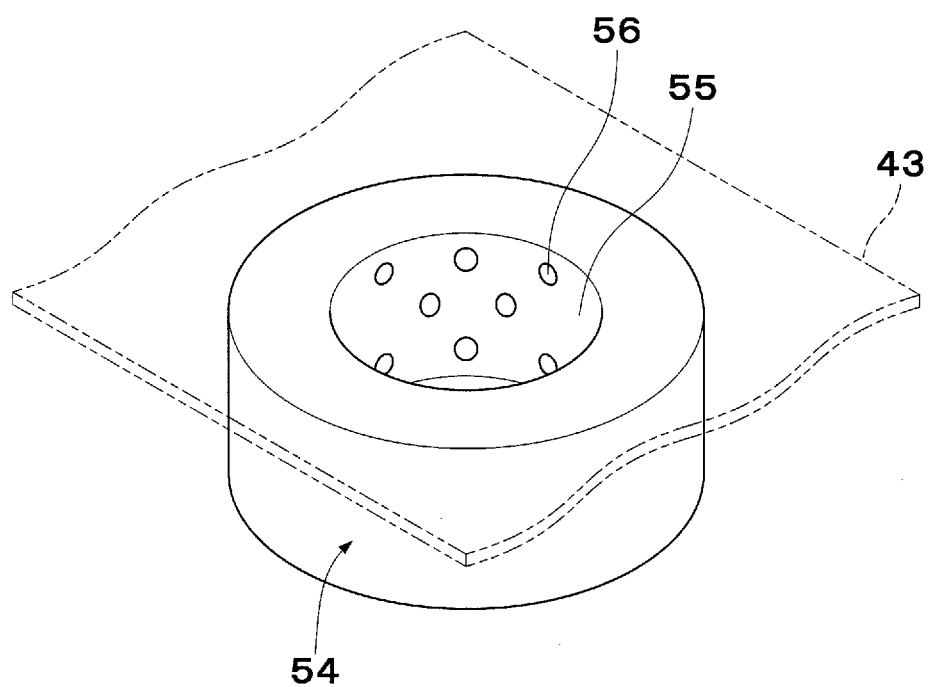
FIG. 25 is a perspective view illustrating an embossed portion forming part of a resin coating device from a trial coating material according to a second embodiment of the present invention.
Figure 26:
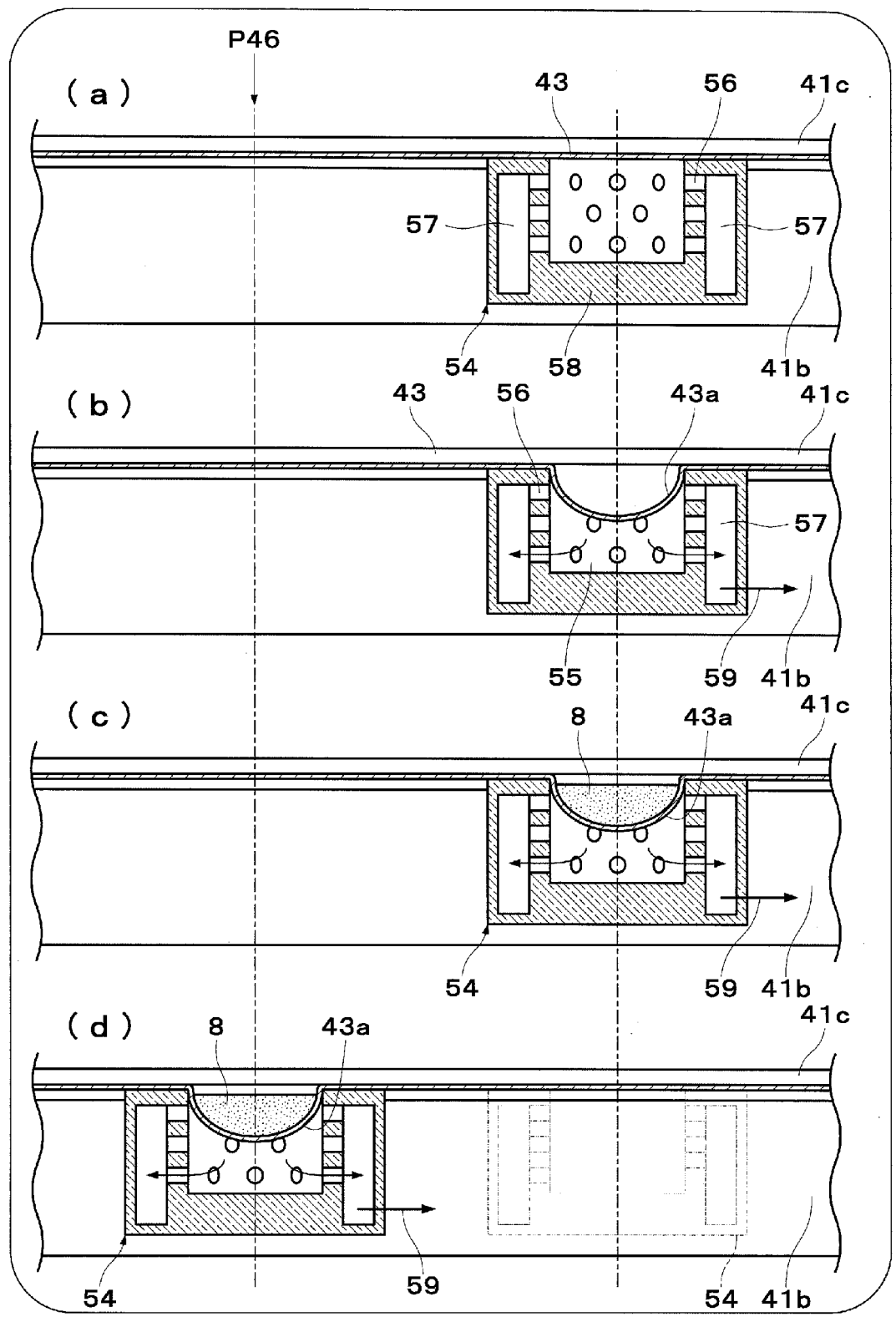
FIGS. 26(a) to 26(d) are process drawings in which the embossed portion forming part is used according to the second embodiment of the present invention.

FIG. 25 is a perspective view of an embossed portion forming part 54 that sucks and holds the tape trial coating material 43 to a trial coating material loading part 41. FIG. 26 is a process drawing illustrating the principle part of a resin coating device including the embossed portion forming part 54.

The embossed portion forming part 54 has a concave portion 55 on the top surface in contact with the back side of the trial coating material 43. Openings 56 formed on the side wall of the concave portion 55 allow a ring-shaped flow path 57, which is formed in the embossed portion forming part 54, to communicate with the inside of the concave portion 55. At least a bottom 58 of the embossed portion forming part 54 is made of a translucent material that does not block light incident on the concave portion 55.

The embossed portion forming part 54 is driven so as to move the trial coating material 43 from the position of a trial coating stage 40a shown in FIG. 7A at least to the position of an irradiation part 46 in synchronization of the winding of the trial coating material 43 by a take-up reel 48.

FIG. 26(a) shows an initial state in which the embossed portion forming part 54 is located at the position of the trial coating stage 40a. Then, in FIG. 26(b), the ring-shaped flow path 57 of the embossed portion forming part 54 is connected to a vacuum source. An arrow 59 indicates a suction state. Thus, a pressure in the concave portion 55 of the trial coating material 43 is reduced so as to suck the flexible trial coating material 43 downward into a dome shape in the concave portion 55, forming an embossed portion 43a.

In FIG. 26(c), a specified amount of the resin 8 is dispensed into the embossed portion 43a by a dispenser nozzle 33a. The trial coating material 43 containing a trial coating of the resin 8 in the embossed portion 43a is transported from the initial state in FIG. 26(c) to a position P46 of the irradiation part 46 in FIG. 26(d) along with the embossed portion forming part 54 kept in a sucked state.

In FIG. 26(d), the embossed portion forming part 54 is still kept in the sucked state. The resin 8 of the embossed portion 43a in this state is irradiated with excitation light from a light source 45 from above. Light emitted from phosphor contained in the resin 8 passes through the bottom of the embossed portion forming part 54 and then strikes a spectroscope 42 through an integrating sphere 44, so that the emission characteristic of the light is measured.

At the completion of the measurement in the irradiation part 46, the suction of the embossed portion forming part 54 is released to return the concave portion 55 to an atmospheric pressure before the take-up reel 48 starts winding up the trial coating material 43. When the take-up reel 48 winds up the trial coating material 43, the embossed portion forming part 54 is driven in the opposite direction from the transport direction of the trial coating material 43 and returns to the position of FIG. 26(a).

The trial coating material 43 of the irradiation part 46 is sucked in this manner by the embossed portion forming part 54, allowing the position of the trial coating material 43 to be stabilized in the irradiation part 46, leading to higher precision of chromaticity correction.

Third Embodiment

In the first embodiment, as illustrated in FIGS. 22(a) and 22(b), the clamp unit 63 provided only on the underside of the trial coating material loading part 41 clamps the trial coating material 43 to a correct position, whereas in the third embodiment, as illustrated in any one of FIGS. 27 to 35, a pressing member for effectively clamping a trial coating material 43 to a correct position is further provided on a trial coating material loading part 41 and is caused to act on the trial coating material 43 as a part of a clamp unit 63, thereby clamping the trial coating material 43 to a more correct position.

FIGS. 27 to 35 are perspective views illustrating the trial coating material 43 from an irradiation part 46 (from above), the trial coating material 43 being pressed to the trial coating material loading part 41. The clamp unit under the trial coating material loading part 41 is identical to that of the first embodiment.

Figure 27:
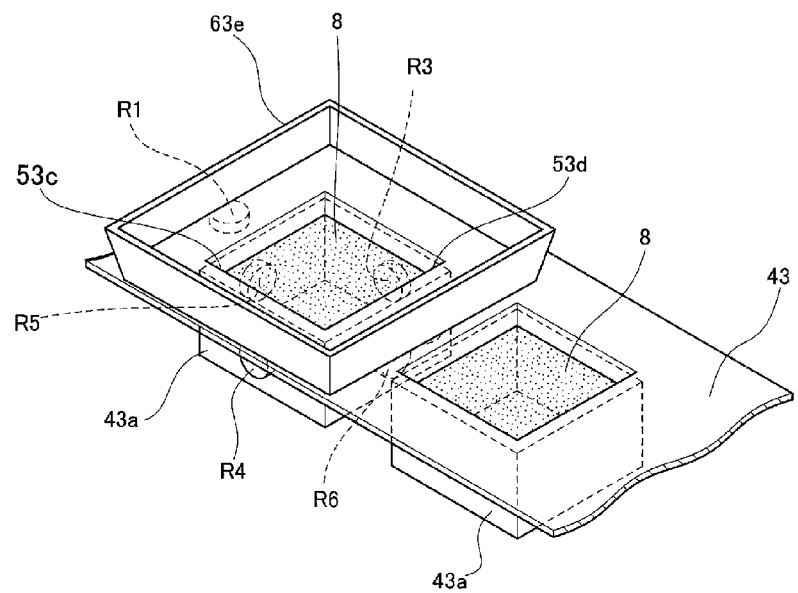
FIG. 27 is a perspective view illustrating a clamp unit according to a third embodiment of the present invention.

A clamp unit 63e in a specific example of FIG. 27 includes a frame pressing member that can press a part surrounding an opening of the trial coating material 43.

Figure 28:
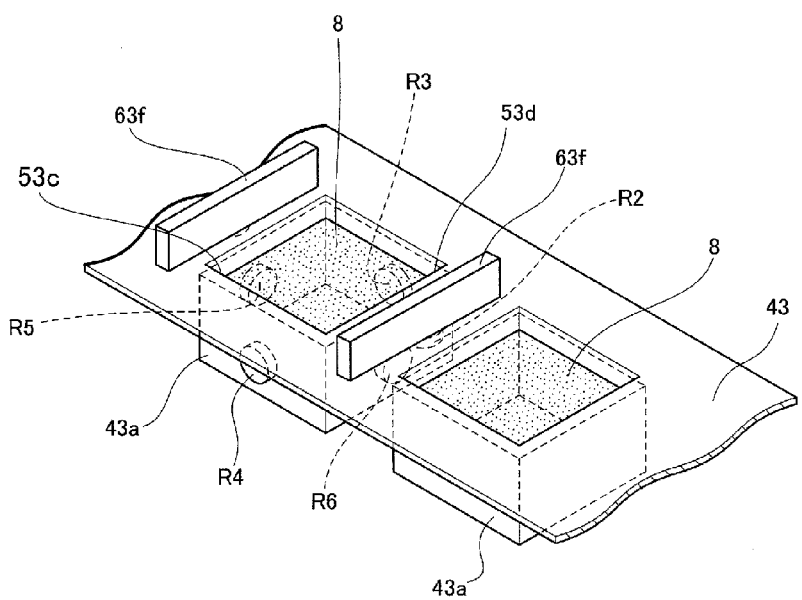
FIG. 28 is a perspective view illustrating another clamp unit according to the third embodiment of the present invention.
Figure 29:
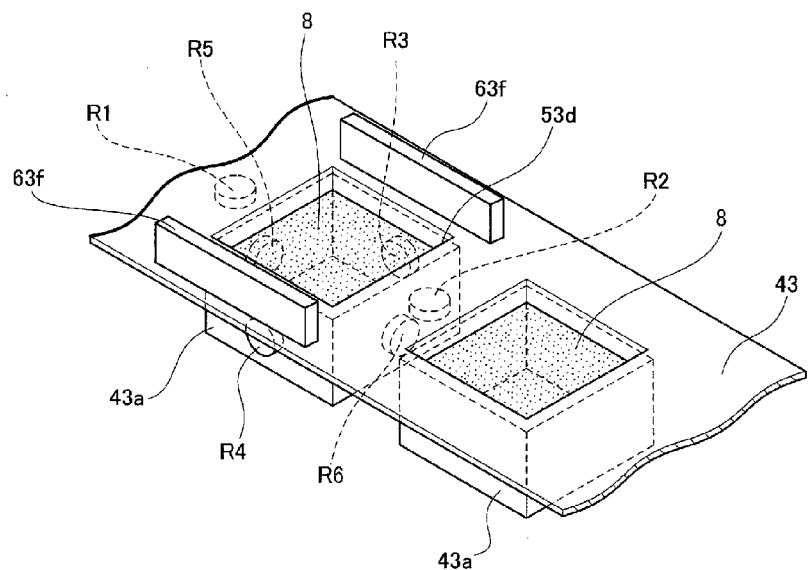
FIG. 29 is a perspective view illustrating another clamp unit according to the third embodiment of the present invention.
Figure 30:
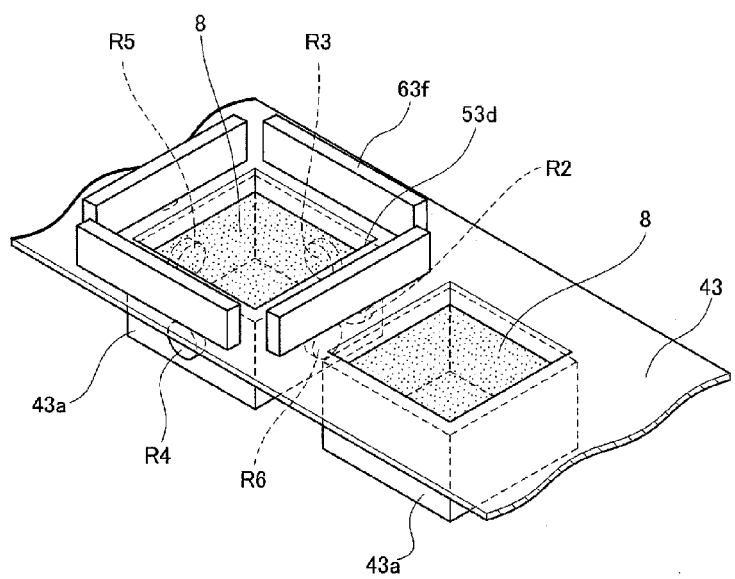
FIG. 30 is a perspective view illustrating another clamp unit according to the third embodiment of the present invention.

A clamp unit 63f in specific examples of FIGS. 28 to 30 includes a rod-like pressing member that can press at least two or four sides of the opening of the trial coating material 43.

Figure 31:
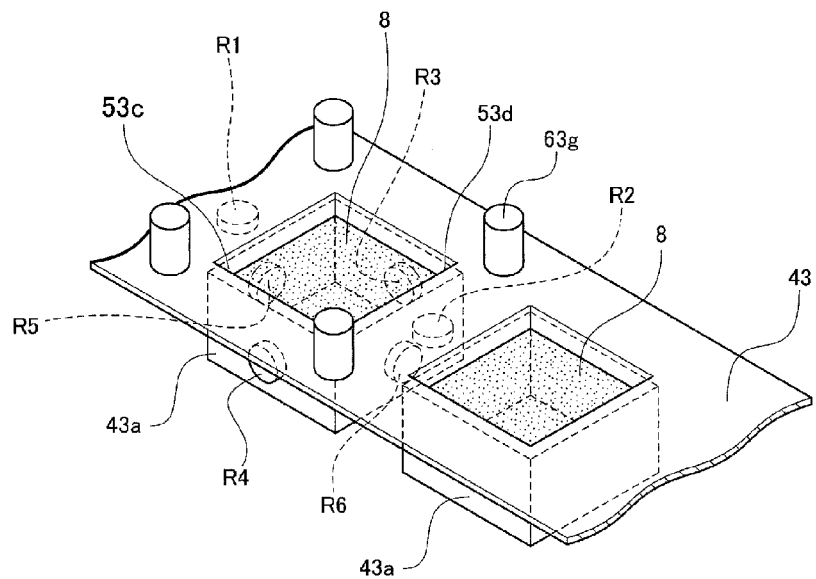
FIG. 31 is a perspective view illustrating another clamp unit according to the third embodiment of the present invention.

A clamp unit 63g in a specific example of FIG. 31 includes cylindrical pressing members that can press the corners of the opening of the trial coating material 43. Four corners are pressed in FIG. 31 but only two corners on a diagonal line may be pressed.

Figure 32:
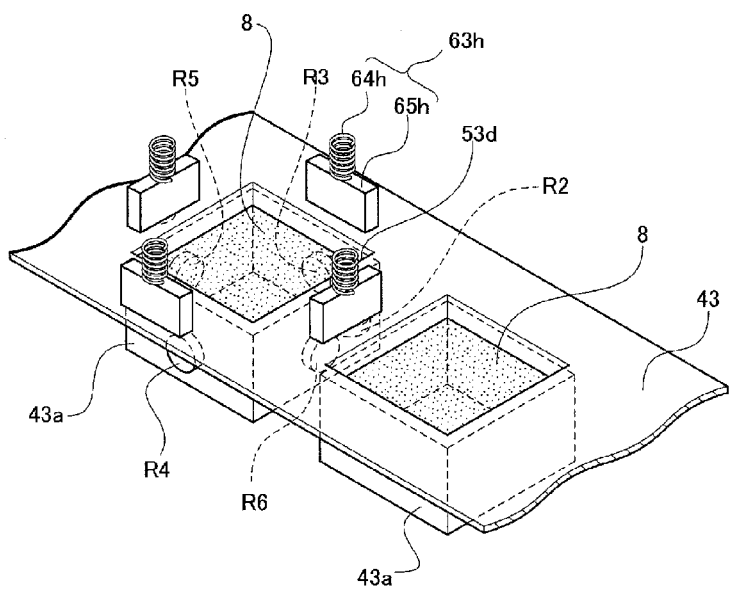
FIG. 32 is a perspective view illustrating another clamp unit according to the third embodiment of the present invention.

In a specific example of FIG. 32, a clamp unit 63h is a combination of a spring (elastic body) 64h and a rod pressing member 65h. The elasticity of the spring 64h can firmly press the rod-like pressing member 65h to the four sides of the opening of the trial coating material 43. At least two sides of the opening need to be pressed. The rod-like pressing member 65h may be as long as one side of the opening like a rod-like pressing member 65i in FIG. 33. The rod-like pressing member 65h may have any length as long as at least one side of the opening is partially pressed.

Figure 33:
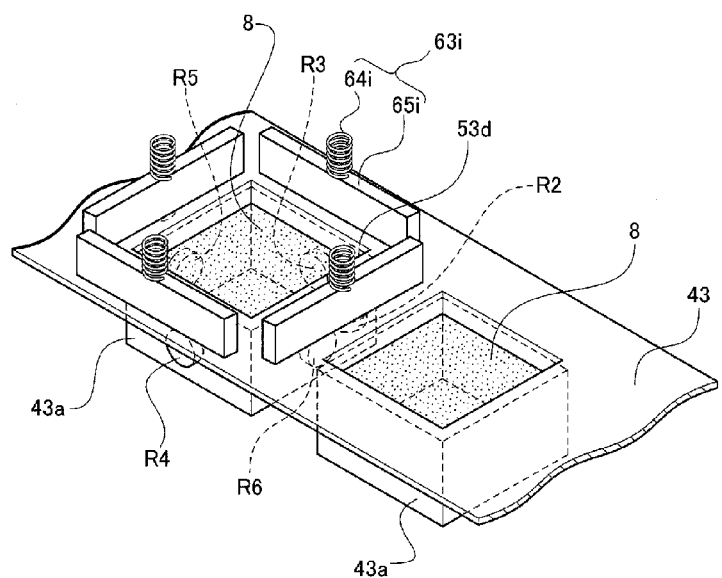
FIG. 33 is a perspective view illustrating another clamp unit according to the third embodiment of the present invention.

A clamp unit 63i in FIG. 33 is a combination of a spring (elastic member) 64i and the rod-like pressing member 65i.

Figure 34:
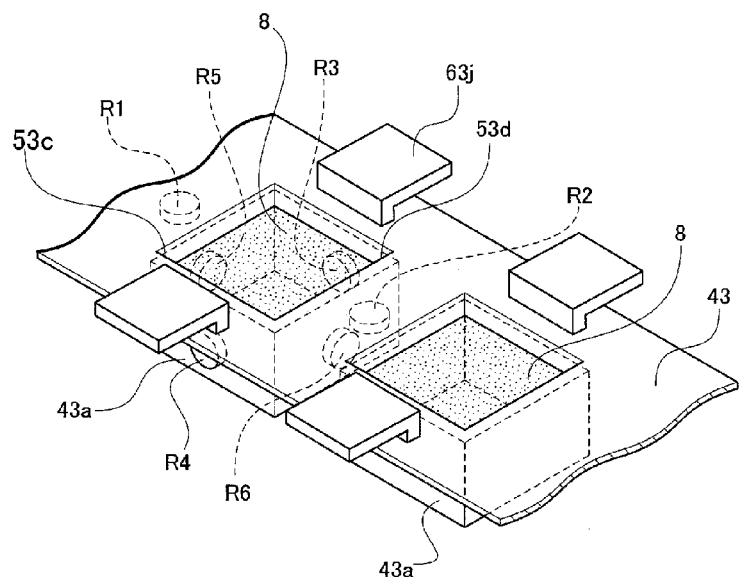
FIG. 34 is a perspective view illustrating another clamp unit according to the third embodiment of the present invention.

A clamp unit 63j in a specific example of FIG. 34 includes a springy plate-like pressing member. The trial coating material 43 is pressed by the end of the pressing member. The pressing member is springy and thus can firmly press the trial coating material 43.

Figure 35:
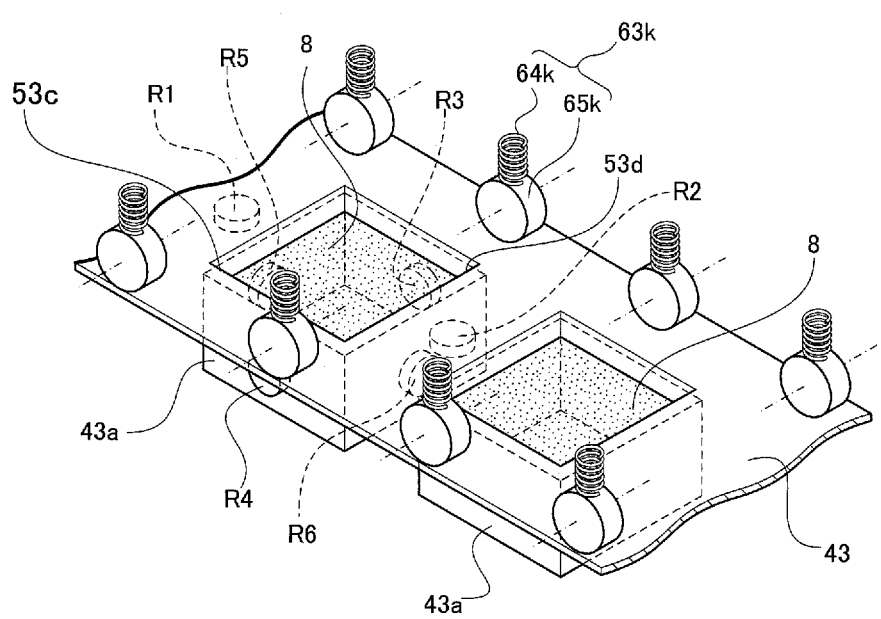
FIG. 35 is a perspective view illustrating another clamp unit according to the third embodiment of the present invention.

A clamp unit 63k in a specific example of FIG. 35 is a combination of a spring (elastic member) 64k and a pressing member 65k shaped like a roller. The clamp unit 63k presses two sides of the trial coating material 43. The roller-like pressing member 65k that presses the trial coating material 43 can rotate according to a movement of the trial coating material 43 while accepting the movement. Thus, the trial coating material 43 moves under the pressing member 65k.

As illustrated in FIGS. 27 to 35, the clamp units 63e to 63k that press the trial coating material 43 from above can be used with the clamp unit 63 that fixes the trial coating material 43 from below as illustrated in FIGS. 22(a) and 22(b) of the third embodiment. For simplicity, the trial coating material 43 may be pressed from above by any one of the clamp units 63e to 63k without using the clamp unit 63 that fixes the trial coating material 43 from below.

The present invention is usable in the field of producing an LED package including an LED element covered with resin containing phosphor.

What is claimed is:

1. A device for resin coating, comprising:
   a resin coating part that applies resin containing phosphor;
   a first coating control unit that controls the resin coating part to apply the resin to a trial coating material;
   a second coating control unit that controls the resin coating part to apply the resin to an LED element;
   a trial coating material loading part loaded with the trial coating material on which the resin has been applied under the control of the first coating control unit;
   a light source that emits excitation light for exciting the phosphor;
   an emission characteristic measuring unit that measures an emission characteristic of light emitted from the resin by irradiating the trial coating of the resin on the trial coating material with the excitation light;
   a clamp unit that locates the trial coating material;
   a coating amount deriving unit that determines a deviation of a measurement result of the emission characteristic measuring unit from a prescribed emission characteristic and derives, based on the deviation, an amount of resin coating to be applied to the LED element; and
   a production unit that notifies the amount of resin coating to the second coating control unit to apply the amount of resin coating to the LED element.

2. The device for resin coating according to claim 1, wherein the clamp unit sucks and holds the trial coating material to the trial coating material loading part, the trial coating material being measured by the emission characteristic measuring unit.

3. The device for resin coating according to claim 1, wherein the trial coating material includes embossed portions coated with the trial coating of the resin, and
   the clamp unit sucks and holds portions between the embossed portions to the trial coating material loading part, the embossed portions being formed next to the trial coating material being measured by the emission characteristic measuring unit.

4. The device for resin coating according to claim 1, wherein the trial coating material includes embossed portions coated with the trial coating of the resin, and the clamp unit sucks and holds at least a part of an outer periphery of the embossed portion to the trial coating material loading part, the embossed portion being formed on the trial coating material being measured by the emission characteristic measuring unit.

5. The device for resin coating according to claim 1, further comprising an embossed portion forming part instead of the clamp unit, the embossed portion forming part including an embossed portion protruded to an underside of the trial coating material by sucking the trial coating material from the underside of the trial coating material, the embossed portion forming part sucking and holding the trial coating material to the trial coating material loading part, the trial coating material being measured by the emission characteristic measuring unit by the suction.

6. The device for resin coating according to claim 1, wherein the clamp unit presses and hold the trial coating material from above to the trial coating material loading part, the trial coating material being measured by the emission characteristic measuring unit.

7. The device for resin coating according to claim 6, wherein the clamp unit is a pressing member shaped like one of a frame, a rod, and a roller.

8. The device for resin coating according to claim 6, wherein the clamp unit includes a pressing member shaped like one of a frame, a rod, and a roller, and an elastic body that presses the pressing member to the trial coating material loading part.

9. A method for resin coating, comprising:
applying, for emission characteristic measurement, resin containing phosphor to a trial coating material by a resin dispensing unit that dispenses the resin;
placing the trial coating material with the trial coating of the resin into a trial coating material loading part;
emitting excitation light for exciting the phosphor from a light source to the trial coating of the resin on the trial coating material in a state in which the trial coating material being measured is located by a clamp unit;
measuring an emission characteristic of light emitted from the resin by the excitation light;
determining a deviation of a measurement result in the emission characteristic measuring step from a prescribed emission characteristic and deriving, based on the deviation, an amount of resin coating to be applied to an LED element; and
applying the amount of resin coating to the LED element by notifying the derived amount of resin coating to a coating control unit that controls the resin dispensing unit.

10. The method for resin coating according to claim 9, wherein in the measurement coating step, the trial coating material is sucked from an underside of the trial coating material by an embossed portion forming part to form an embossed portion protruding to the underside of the trial coating material, and the trial coating of the resin for emission characteristic measurement is applied to the formed embossed portion,
in the excitation light emitting step,
the trial coating of the resin applied to the embossed portion is irradiated with excitation light for exciting the phosphor from the light source, and
in the emission characteristic measuring step,
an emission characteristic of light emitted by the excitation light from the resin of the embossed portion being formed by the suction is measured.

* * * * *

UNITED STATES PATENT AND TRADEMARK OFFICE
CERTIFICATE OF CORRECTION

| | | |
|---|---|---|
| PATENT NO. | : 8,525,217 B2 | Page 1 of 1 |
| APPLICATION NO. | : 13/593104 | |
| DATED | : September 3, 2013 | |
| INVENTOR(S) | : Nishiwaki et al. | |

It is certified that error appears in the above-identified patent and that said Letters Patent is hereby corrected as shown below:

On the title page, item 30, Foreign Application Priority Data: After "2011-185406", start a new line with the following: --June 13, 2012   (JP) ........................ 2012-133338--.

Signed and Sealed this
Eighteenth Day of February, 2014

Michelle K. Lee
*Deputy Director of the United States Patent and Trademark Office*